US011353170B2

(12) United States Patent
McRae

(10) Patent No.: US 11,353,170 B2
(45) Date of Patent: **\*Jun. 7, 2022**

(54) APPARATUS AND METHOD FOR HARVESTING ENERGY FOR A LIGHT

(71) Applicant: National Christmas Products LLC, Cranford, NJ (US)

(72) Inventor: Michael M. McRae, Ormond Beach, FL (US)

(73) Assignee: National Christmas Products LLC, Cranford, NJ (US)

( \* ) Notice: Subject to any disclaimer, the term of this patent is extended or adjusted under 35 U.S.C. 154(b) by 0 days.

This patent is subject to a terminal disclaimer.

(21) Appl. No.: 17/075,288

(22) Filed: Oct. 20, 2020

(65) Prior Publication Data

US 2021/0033249 A1 Feb. 4, 2021

Related U.S. Application Data

(63) Continuation-in-part of application No. 16/673,372, filed on Nov. 4, 2019, now Pat. No. 10,851,956, (Continued)

(51) Int. Cl.
*F21S 9/02* (2006.01)
*F21L 4/08* (2006.01)
(Continued)

(52) U.S. Cl.
CPC . *F21L 4/08* (2013.01); *F21S 9/02* (2013.01); *H02J 50/005* (2020.01); *H05B 45/20* (2020.01);
(Continued)

(58) Field of Classification Search
CPC ...... F21V 15/01; F21V 23/003; F21V 21/088; H02J 50/20; H02J 50/10; H02J 7/025;
(Continued)

(56) References Cited

U.S. PATENT DOCUMENTS 9,281,426 B2 \* 3/2016 Nguyen .............. H01M 8/0232
2010/0124050 A1 5/2010 Hau et al.
(Continued)

FOREIGN PATENT DOCUMENTS

DE 3824972 A1 1/1989
DE 102004022759 A1 2/2006
(Continued)

*Primary Examiner* — Fatima N Farokhrooz
(74) *Attorney, Agent, or Firm* — Ellenoff Grossman & Schole LLP; James M. Smedley; Alex Korona

(57) ABSTRACT

An apparatus is disclosed. The apparatus has a lighting component, an energy storage assembly electrically connected to the lighting component, and a housing. The energy storage assembly is a Graphene stack battery that includes a Graphene strip. The energy storage assembly is disposed on or in the housing. The lighting component is disposed on or in the housing. The Graphene strip is a folded Graphene strip with a folded serpentine shape having intervening insulation strips disposed between a plurality of folded Graphene strip portions with leads at the two ends of the Graphene strip.

20 Claims, 22 Drawing Sheets

Related U.S. Application Data which is a continuation-in-part of application No. 16/418,517, filed on May 21, 2019, now Pat. No. 10,718,478.

(60) Provisional application No. 62/688,954, filed on Jun. 22, 2018.

(51) Int. Cl.
| | | |
|---|---|---|
| *H05B 45/20* | (2020.01) | |
| *H02J 50/00* | (2016.01) | |
| *H05B 47/19* | (2020.01) | |
| *F21W 121/04* | (2006.01) | |
| *F21Y 115/10* | (2016.01) | |

(52) U.S. Cl.
CPC ......... *H05B 47/19* (2020.01); *F21W 2121/04* (2013.01); *F21Y 2115/10* (2016.08)

(58) Field of Classification Search
CPC . H01L 33/62; F21S 6/001; F21S 10/04; F21S 9/00; F21W 2121/06; F21W 2101/00; F21W 2121/04; F21W 2121/00; F21Y 2115/10; H01K 7/06
See application file for complete search history.

(56) References Cited

U.S. PATENT DOCUMENTS

| | | | |
|---|---|---|---|
| 2013/0085359 A1* | 4/2013 | Yao | A61B 5/291 600/372 |
| 2013/0323585 A1* | 12/2013 | Inoue | H01G 11/66 429/211 |
| 2014/0099554 A1* | 4/2014 | Inoue | H01G 11/06 423/325 |
| 2015/0130395 A1* | 5/2015 | Rice | H01G 11/32 320/101 |
| 2015/0207148 A1 | 7/2015 | Kimura et al. | |
| 2019/0390829 A1 | 12/2019 | McRae | |
| 2020/0063929 A1 | 2/2020 | McRae | |

FOREIGN PATENT DOCUMENTS

| | | |
|---|---|---|
| DE | 202012103800 U1 | 11/2012 |
| WO | 2016116829 A1 | 7/2016 |

\* cited by examiner

APPARATUS AND METHOD FOR HARVESTING ENERGY FOR A LIGHT

CROSS-REFERENCE TO RELATED APPLICATIONS

This application claims the benefit of U.S. nonprovisional patent application Ser. No. 16/673,372 filed on Nov. 4, 2019, which claims the benefit of U.S. nonprovisional patent application Ser. No. 16/418,517 filed on May 21, 2019, which claims the benefit of U.S. provisional application 62/688,954 filed on Jun. 22, 2018, the entire disclosure of each of which is incorporated herein by reference.

TECHNICAL FIELD

The present disclosure generally relates to an apparatus and method for harvesting energy, and more particularly to an apparatus and method for harvesting energy for a light.

BACKGROUND

Artificial illumination includes light that is not natural light. Artificial light may be a product of human creative activity. Some artificial light may be employed for decoration, safety, or convenience. In some scenarios, decorative light displays may involve illumination of many lights.

Users of illuminated artificial lights include individuals and organizations. Some decorative artificial lights may be utilized during holidays or special occasions. Some holiday seasons may last weeks or months. A decorative artificial light display may thereby remain illuminated for an extended period of time.

Illuminating artificial lights involves an energy source. Some artificial lights may be powered with various electrical energy sources. In some scenarios, artificial lights may be powered with electrical energy from, for example, a battery or an electrical distribution grid. However, sustained illumination of some battery-powered artificial lights may involve costly battery replacement or inconvenient battery recharging. Also, some illuminated artificial lights powered from an electrical distribution grid may involve cumbersome power cord connection.

The exemplary disclosed apparatus and method are directed to overcoming one or more of the shortcomings set forth above and/or other deficiencies in existing technology.

SUMMARY OF THE DISCLOSURE

In one exemplary aspect, the present disclosure is directed to an apparatus. The apparatus includes a lighting component, an energy storage assembly electrically connected to the lighting component, and a housing. The energy storage assembly is a Graphene stack battery that includes a Graphene strip. The energy storage assembly is disposed on or in the housing. The lighting component is disposed on or in the housing. The Graphene strip is a folded Graphene strip with a folded serpentine shape having intervening insulation strips disposed between a plurality of folded Graphene strip portions with leads at the two ends of the Graphene strip.

In another exemplary aspect, the present disclosure is directed to a method. The method includes providing a plurality of lighting components, electrically connecting an energy storage assembly to the plurality of lighting components, and disposing the plurality of lighting components and the energy storage assembly on or in a housing. The energy storage assembly is a Graphene stack battery that includes a Graphene strip. The Graphene strip is a folded Graphene strip with a folded serpentine shape having intervening insulation strips disposed between a plurality of folded Graphene strip portions with leads at the two ends of the Graphene strip.

In one exemplary aspect, the present disclosure is directed to an apparatus. The apparatus includes a housing, a lighting component supported by the housing, an energy storage assembly disposed in a first cavity of the housing and electrically connected to the lighting component, a control assembly disposed in the first cavity of the housing and electrically connected to the energy storage assembly, and an energy receiving component electrically connected to the control assembly via at least one lead disposed in at least one second cavity of the housing. The energy receiving component wirelessly receives energy. The energy storage assembly includes a Graphene strip.

In another exemplary aspect, the present disclosure is directed to a system. The system includes a lighting apparatus including a housing, an LED supported by the housing, an energy storage assembly disposed in a first cavity of the housing and electrically connected to the LED, a control assembly disposed in the first cavity of the housing and electrically connected to the energy storage assembly, and an energy receiving component electrically connected to the control assembly via at least one lead disposed in at least one second cavity of the housing, an energy source, and an attachment assembly that is removably attachable to the lighting apparatus. The energy receiving component wirelessly receives energy from the energy source.

In another exemplary aspect, the present disclosure is directed to an apparatus. The apparatus includes a lighting component, an energy storage assembly electrically connected to the lighting component, a control assembly electrically connected to the energy storage assembly, and an energy receiving component electrically connected to the control assembly. The energy receiving component wirelessly receives energy. The energy storage assembly includes a Graphene strip.

In another exemplary aspect, the present disclosure is directed to a method. The method includes providing a multicompartment assembly including a first deposition vacuum chamber, a first cooling vacuum chamber, a second deposition vacuum chamber, and a second cooling vacuum chamber, passing a belt through the first deposition vacuum chamber, the first cooling vacuum chamber, the second deposition vacuum chamber, and the second cooling vacuum chamber, and depositing Graphene on the belt as the belt passes through the first deposition vacuum chamber. The method also includes cooling the deposited Graphene on the belt as the belt passes through the first cooling vacuum chamber, depositing insulation material on the cooled deposited Graphene on the belt as the belt passes through the second deposition chamber, and cooling the deposited insulation material on the cooled deposited Graphene on the belt as the belt passes through the second cooling vacuum chamber.

DETAILED DESCRIPTION AND INDUSTRIAL APPLICABILITY

In at least some exemplary embodiments, the exemplary disclosed apparatus and method include configuring an LED with a power source including a battery, coupling the LED with an Energy Harvester adapted to capture ambient energy from Wi-Fi radiation (e.g., and/or radiofrequency electromagnetic radiation), storing Wi-Fi energy (e.g., and/or radiofrequency electromagnetic radiation energy) in the battery, and powering the LED from the Wi-Fi energy (e.g., and/or radiofrequency electromagnetic radiation energy) stored in the battery. In an illustrative example, the battery may be a rechargeable battery. The rechargeable battery may be, for example, a Graphene Capacitor/Battery (e.g., or any other suitable type of battery formed from any other suitable material such as material having similar properties as Graphene), permitting a battery with a reduced size to store adequate charge to power an LED for a useful time period. In at least some exemplary embodiments, the Graphene Capacitor/Battery may be constructed based on vacuum deposition of Graphene strips with intervening insulation strips. In some examples, the Energy Harvester may be tunable, permitting energy harvest from energy sources radiating at various frequencies. Various exemplary embodiments may power LEDs with harvested wireless energy, permitting illumination at reduced cost for extended time periods.

Figure 1A:
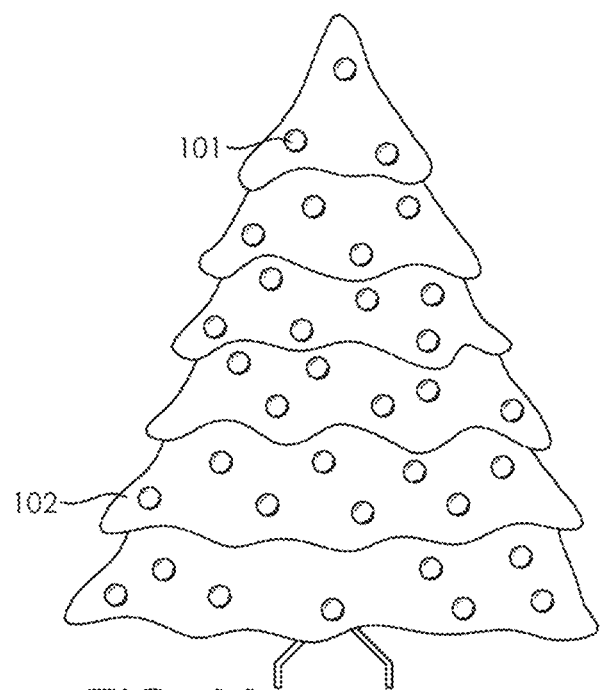
FIGS. 1A, 1B, 1C, and 1D depict exemplary embodiments of harvested energy powered light embodiment decorations configured with an LED having a power source including a battery coupled with an LED and an Energy Harvester adapted to capture ambient energy from Wi-Fi radiation (e.g., and/or radiofrequency electromagnetic radiation), to store Wi-Fi energy (e.g., and/or radiofrequency electromagnetic radiation energy) in the battery, and power the LED from the Wi-Fi energy (e.g., and/or radiofrequency electromagnetic radiation energy) stored in the battery.
Figure 1B:
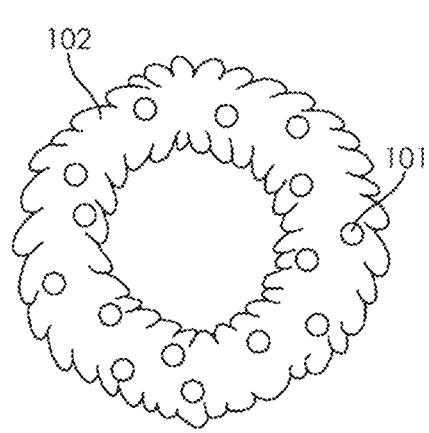
Figure 1D:
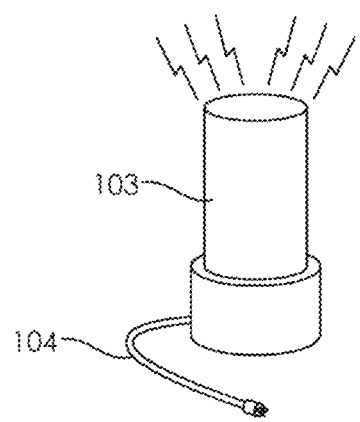
Figure 1C:
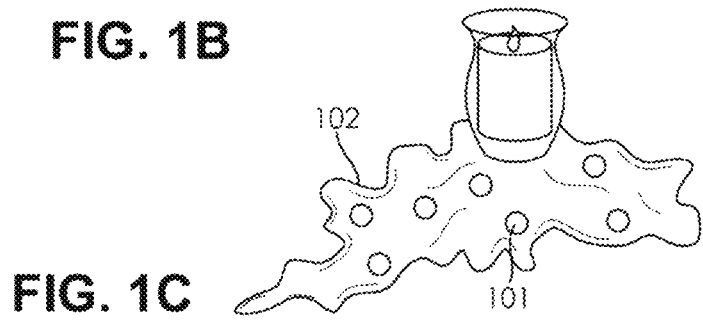

FIGS. 1A through 1D depict exemplary harvested energy powered light decorations configured with an LED having a power source including a battery coupled with an LED and an Energy Harvester adapted to capture ambient energy from Wi-Fi radiation (e.g., and/or radiofrequency electromagnetic radiation), store Wi-Fi energy (e.g., and/or radiofrequency electromagnetic radiation energy) in the battery, and power the LED from the Wi-Fi energy (e.g., and/or radiofrequency electromagnetic radiation energy) stored in the battery. FIGS. 1A, 1B, and 1C illustrate a group of exemplary decorations 102 with exemplary LED assemblies 101 (e.g., in place as determined by the user). FIG. 1D illustrates an exemplary wireless Wi-Fi/RF source of energy 103 having for example a power cord 104. Source of energy 103 may include a remote-control unit that sends signals for control to an LED assembly receiver.

Figure 2:
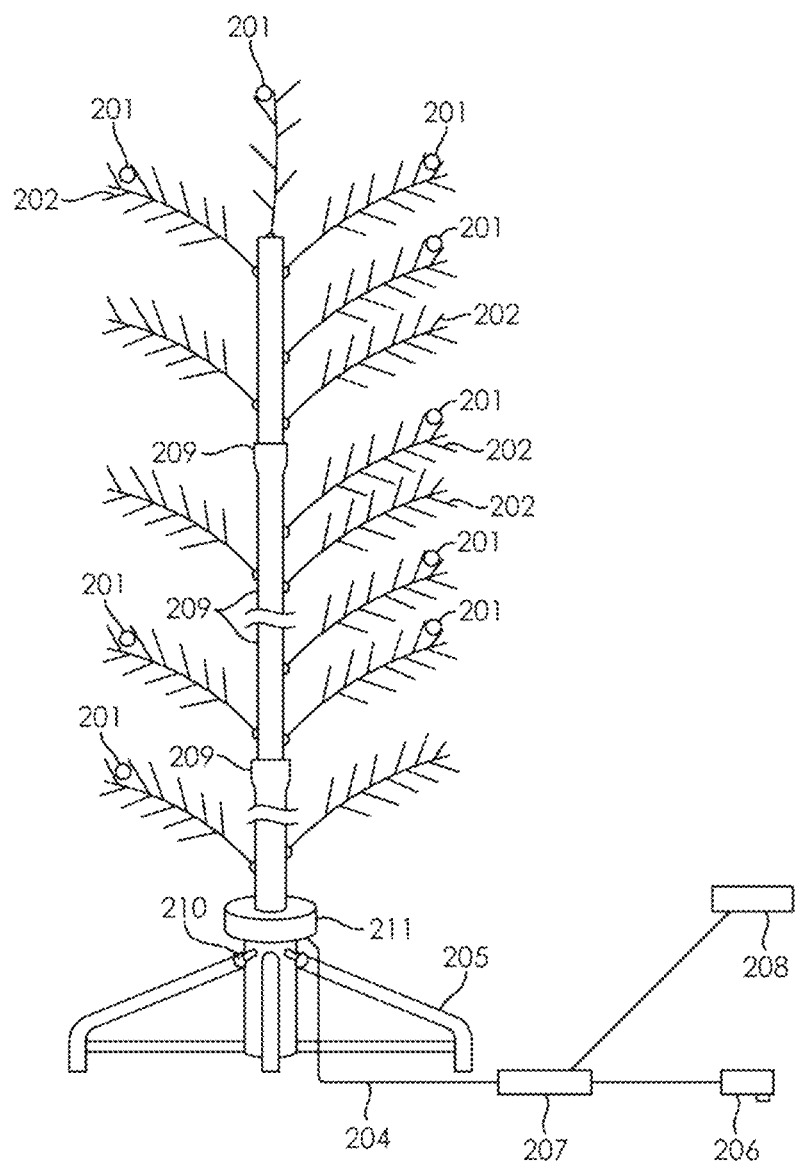
FIG. 2 depicts an exemplary harvested energy powered light embodiment decorative tree configured with an LED having a power source including a battery coupled with an LED and an Energy Harvester adapted to capture ambient energy from Wi-Fi radiation (e.g., and/or radiofrequency electromagnetic radiation), to store Wi-Fi energy (e.g., and/or radiofrequency electromagnetic radiation energy) in the battery, and power the LED from the Wi-Fi energy (e.g., and/or radiofrequency electromagnetic radiation energy) stored in the battery.

FIG. 2 illustrates an exemplary harvested energy powered light embodiment decorative tree configured with an LED having a power source including a battery coupled with an LED and an Energy Harvester adapted to capture ambient energy from Wi-Fi radiation (e.g., and/or radiofrequency electromagnetic radiation), store Wi-Fi energy (e.g., and/or radiofrequency electromagnetic radiation energy) in the battery, and power the LED from the Wi-Fi energy (e.g., and/or radiofrequency electromagnetic radiation energy) stored in the battery. FIG. 2 illustrates a group of exemplary decorations 202 with exemplary LED assemblies 201. For example, FIG. 2 illustrates an artificial decorative tree in which a tree stand 205 (e.g., having tree stand securing bolts 210) has a Wi-Fi or RF transmitter housing 211 (e.g., transmitter case) that receives its power via a wire cable 204 that is connected to a control 207 that receives power from a voltage adapter 206 that may plug into a household power socket. Control 207 may receive function signals from a remote-control unit 208. Transmitter housing 211 may contain a transmitter that transmits power wirelessly up the tree to LED light assemblies 201 mounted on decorations 202 (e.g., branches) of tree sections 209.

Figure 3:
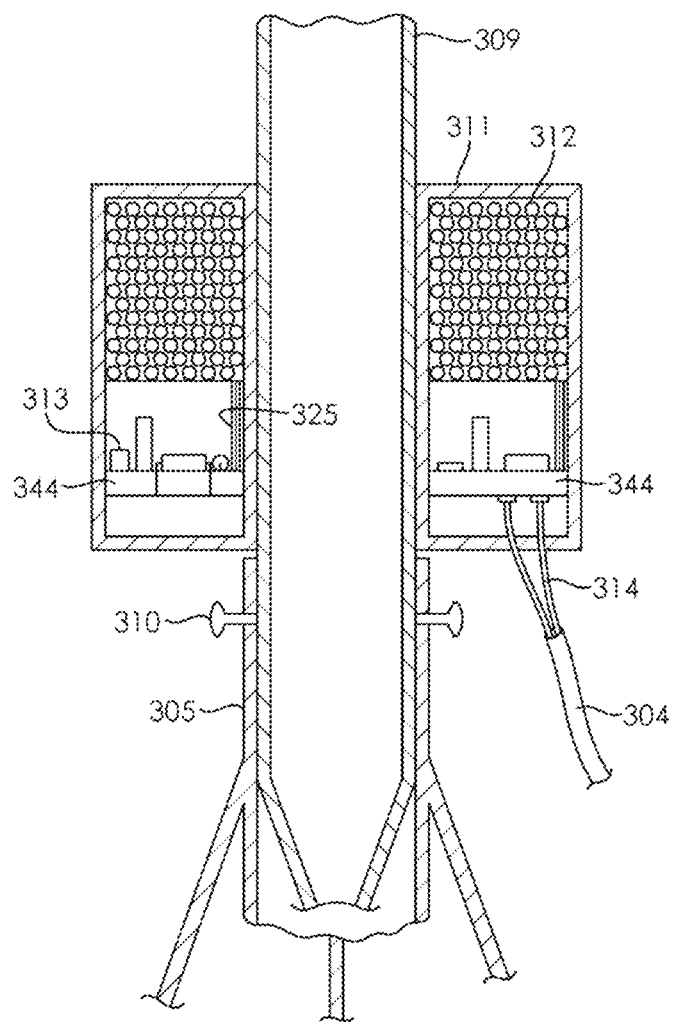
FIG. 3 depicts a cross section view of an exemplary transmitter case.

FIGS. 3-7 illustrate exemplary embodiments of LED assemblies powered via harvested energy stored in one or more energy storage devices (e.g., a Graphene battery). FIG. 3 illustrates a cross-sectional view of an exemplary transmitter case. FIG. 3 illustrates a cross section drawing for a transmitter case 311 that may house a transmitting coil 312, which may be connected by coil leads 325 to a circuit board 344. Transmitter case 311 may also include Wi-Fi or RF transmitting control components 313 and may receive power from power leads 314 housed in a power cord 304. In at least some exemplary embodiments, transmitter case 311 may be placed on a member (e.g., tree pole 309) above a tree stand 305 that may be secured by tree stand securing bolts 310.

Figure 4A:
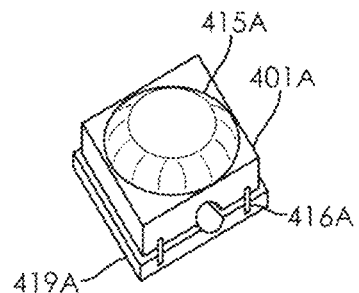
FIGS. 4A, 4B, and 4C depict various exemplary embodiments of illustrative LED assembly designs.
Figure 4B:
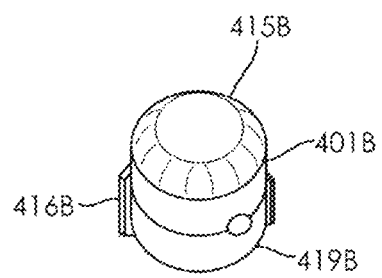
Figure 4C:
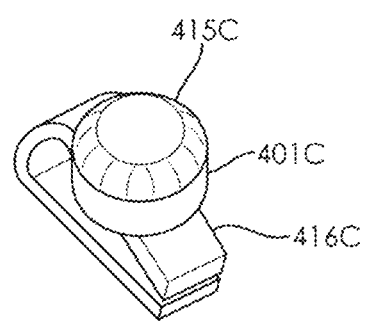

FIGS. 4A, 4B, and 4C illustrate various exemplary embodiments of LED assemblies. FIG. 4A illustrates an LED assembly 401A that may include an LED lens 415A, an LED base 419A, and a securing clip 416A. FIG. 4B illustrates an LED assembly 401B that may include an LED lens 415B, an LED base 419B, and a securing clip 416B. FIG. 4C illustrates an LED assembly 401C that may include an LED lens 415C and a securing clip 416C.

Figure 5:
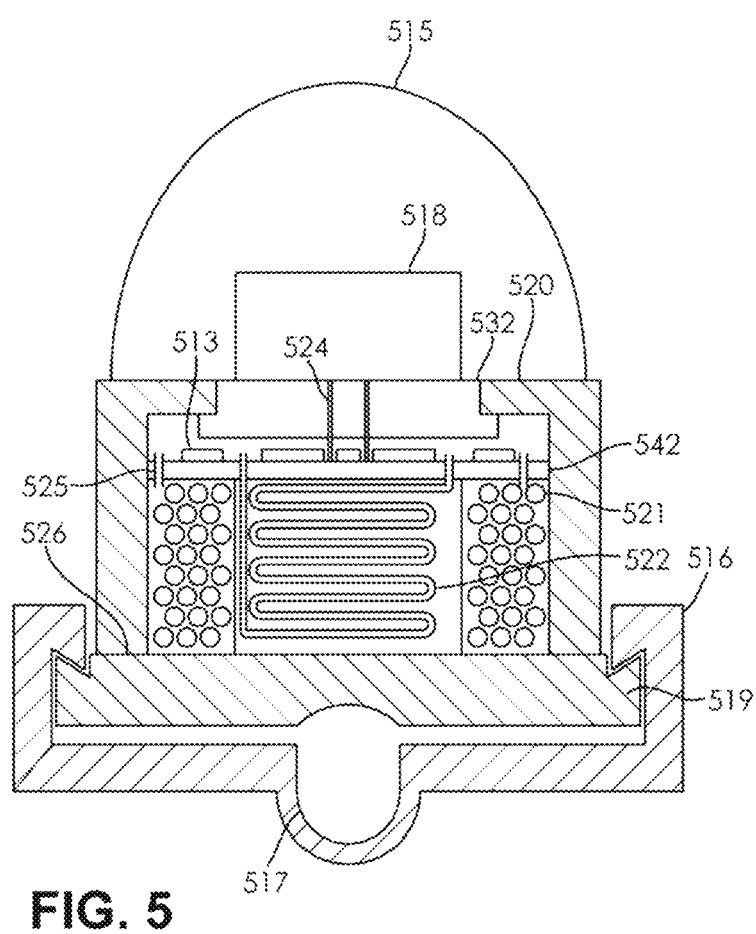
FIG. 5 depicts an illustrative a cross sectional view of an LED assembly with an LED lens covering the LED.

FIG. 5 illustrates a cross sectional view of an exemplary LED assembly having an LED lens covering an LED. In addition to being an LED assembly, the exemplary disclosed lighting assembly may be any desired lighting assembly such as, for example, an incandescent lighting assembly, a halogen lighting assembly, or any other desired type of lighting assembly. An LED lens 515 may cover an LED 518. Leads 524 may connect to LED 518 through an opening in a heat sink 532 on which LED 518 is mounted to a circuit board 542. Circuit board 542 may include frequency tuning, Wi-Fi receiver components, circuitry 513, and/or function controls. Circuit board 542 may be connected to a Graphene and cellulose insulator stack battery 522. Circuit board 542 may also be connected to a receiving coil 521 by leads 525. Receiving coil 521 may for example receive or collect energy transferred by a transmitting coil (e.g., transmitting coil 312) or any other suitable Wi-Fi or RF source. Components of circuit board 542 may harvest the energy collected by receiving coil 521, and this energy may be stored in stack battery 522, which may be used to power LED 518. Circuit board 542, receiving coil 521, and/or stack battery 522 may be electrically connected to facilitate transfer of energy to LED 518. Lens 515 may be mounted on a housing 520 that may be bonded to a base 519 by a bond 526 (e.g., bonding material) and a mounting clip 517 including a portion 516 that may receive the LED assembly.

Figure 6A:
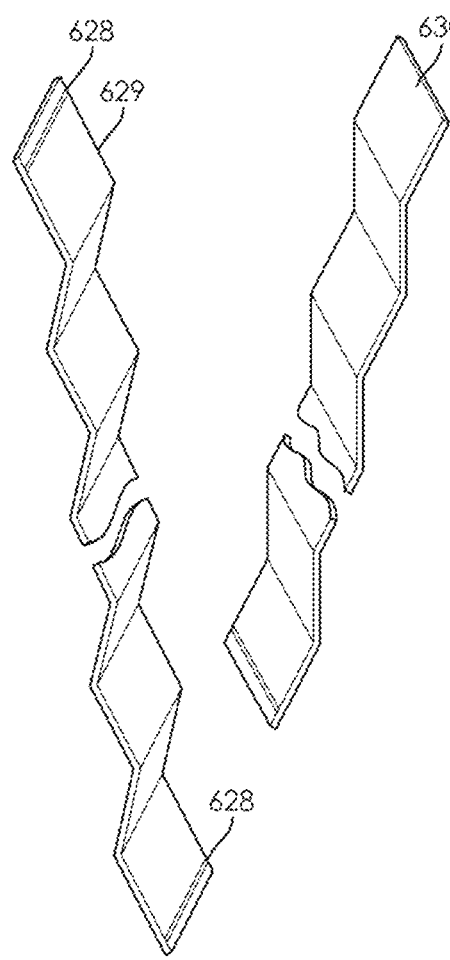
FIGS. 6A and 6B depict an illustrative stack assembly of an exemplary Graphene stack battery.
Figure 6B:
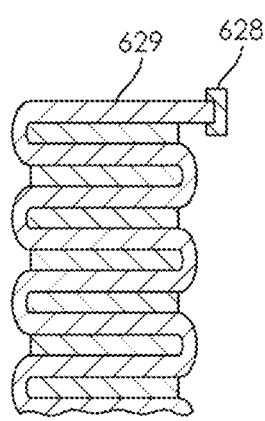
Figure 6B:
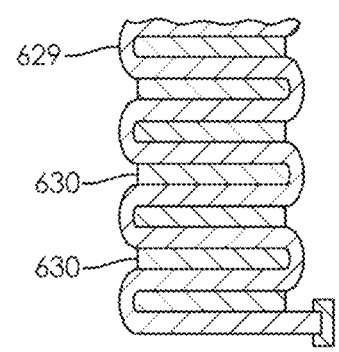

FIG. 6A illustrates an exemplary stack assembly of an exemplary Graphene stack battery. A Graphene stack battery 622 may be made by the assembly of a single atom Graphene strip 629 that may include a battery electrode (e.g., to a lead bonding area 628 that may be folded in layers with an insulator strip 630 such as a cellulose strip or any other suitable insulator material). FIG. 6B illustrates Graphene strip 629 and insulator strip 628 folded in a stack configuration with lead bonding area 628 at each end.

Figure 7:
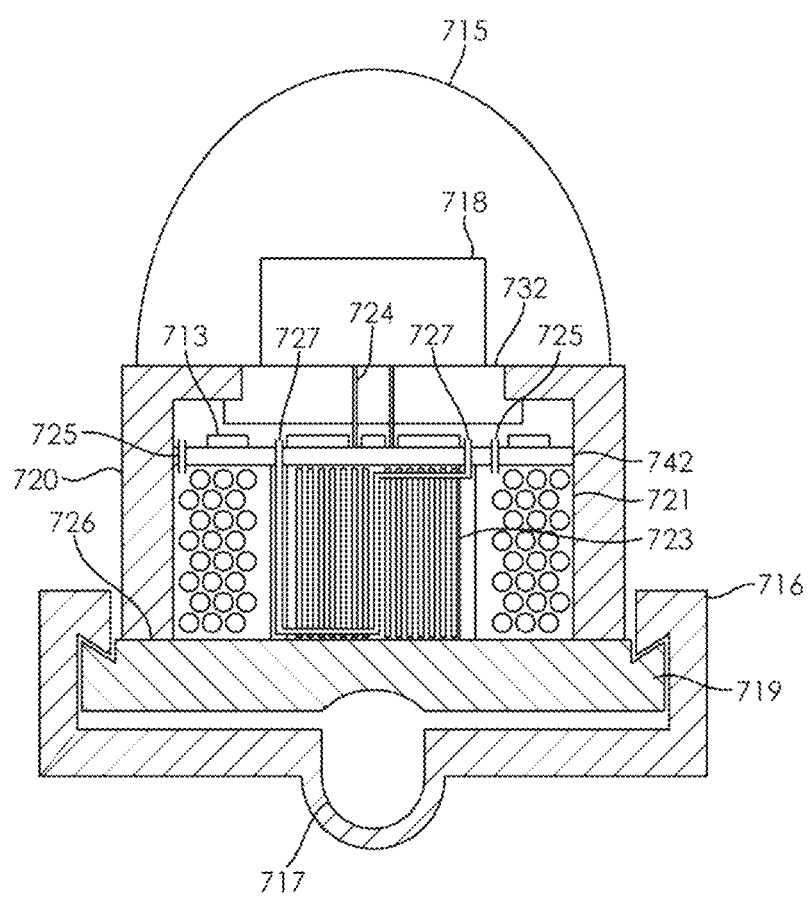
FIG. 7 depicts an illustrative cross section view of an alternative embodiment LED assembly having an LED lens covering the LED.

FIG. 7 illustrates a cross section view of another exemplary embodiment of an LED assembly having an LED lens covering the LED. An LED lens 715 may cover an LED 718. Leads 724 may pass through an opening in a heat sink 732. The assembly may also include a circuit board 742 (e.g., may include circuitry 713) that may be similar to circuit board 542. Circuit board 742 may be connected to a Graphene and cellulose insulator stack battery 723. Circuit board 742 may also be connected to a receiving coil 721 by leads 725. Lens 715 may be mounted on a housing 720 that may be bonded to a base 719 by a bond 726 (e.g., bonding material) and a mounting clip 717 including a portion 716 that may receive the LED assembly. The exemplary assembly may also include battery leads 727 that may connect Graphene and cellulose insulator stack battery 723 to circuit board 742. In at least some exemplary embodiments, stack battery 723 may be disposed with folded segments that extend substantially vertically as illustrated in FIG. 7 (e.g., as compared to folded segments of stack battery 522 that extend substantially horizontally as illustrated in FIG. 5).

Figure 8:
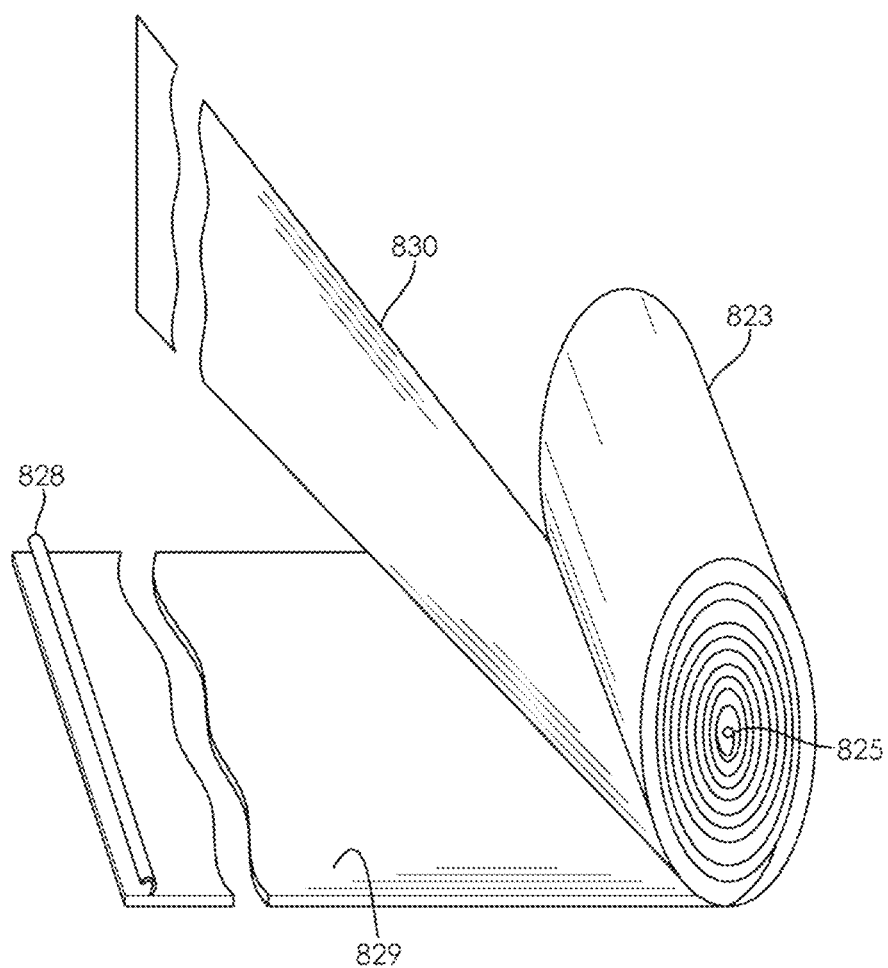
FIG. 8 depicts an embodiment method to assemble an exemplary capacitor type coil that acts as a Graphene battery.

FIGS. 8-11 illustrate exemplary methods and apparatuses for manufacturing an exemplary battery (e.g., Graphene battery) as described for example herein. FIG. 8 illustrates an exemplary method to assemble an exemplary capacitor-type coil (or capacitor coil) that may serve as a Graphene battery. For example, a capacitor-type coil may be assembled, which may form a Graphene battery 823. A one atom thick strip with an insulator 830 of similar thickness with a bonding to lead area at each end 828 (e.g., a battery electrode to lead bond) of a graphene strip 829 may be assembled. Lead 825 may come from (e.g., be connected to) a center portion of the coil.

Figure 9:
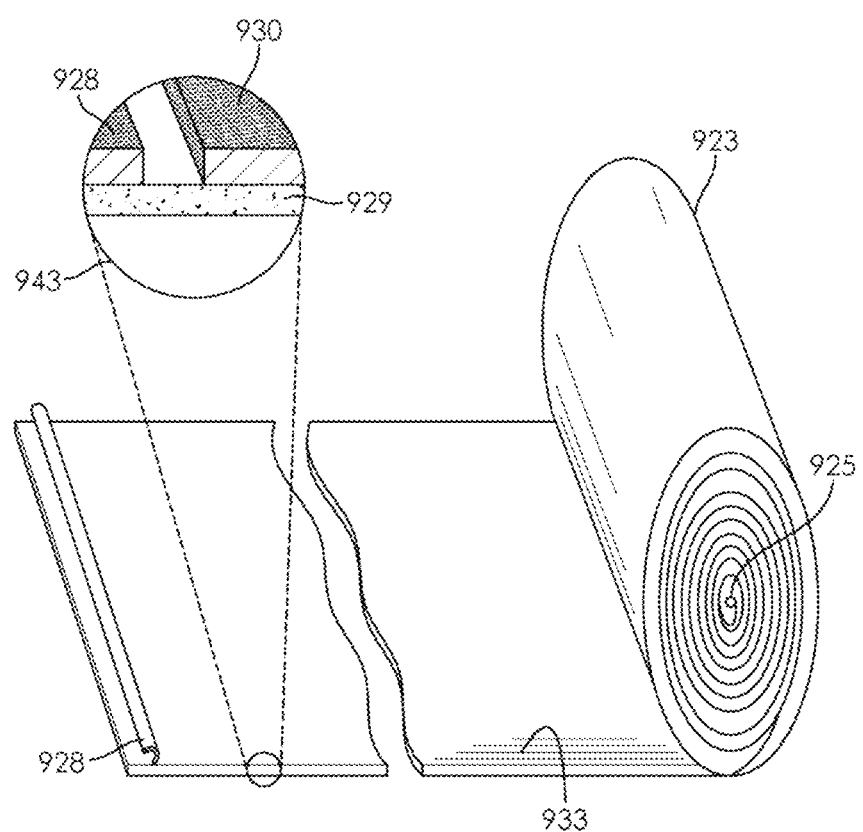
FIG. 9 depicts an alternative embodiment method to assemble an exemplary capacitor type coil that acts as a Graphene battery.

FIG. 9 illustrates another exemplary embodiment of a capacitor-type coil that may serve as a Graphene battery. FIG. 9 illustrates an exemplary method of assembling a capacitor-type coil Graphene battery 923 in which a Graphene strip 929 may be bonded with an insulation material 930 as a single strip 933. A bonded lead area 928 may be disposed at a point of fabrication (e.g., as seen in an exploded view 943 in FIG. 9). A coil lead 925 may connect to a center portion of capacitor-type coil Graphene battery 923.

Figure 10:
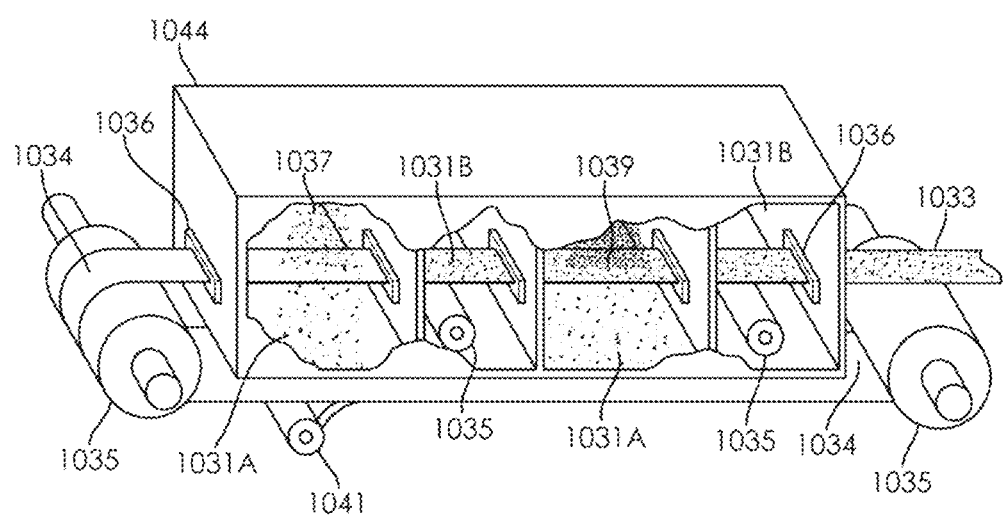
FIG. 10 depicts an exemplary method and apparatus to fabricate exemplary Graphene and insulation strips using a multicompartment vacuum chamber.

FIG. 10 illustrates an exemplary method and apparatus for fabricating at least some exemplary embodiments of Graphene and insulation strips using a multicompartment vacuum chamber. FIG. 10 illustrates an exemplary fabrication method of a Graphene and insulation strip 1033, using a multicompartment vacuum chamber 1044. A belt (e.g., continuous stainless steel substrate deposition belt 1034) may run through vacuum chamber 1044 having a plurality of vacuum seals 1036 (e.g., a vacuum seal 1036 for each compartment). Stainless steel substrate deposition belt 1034 may run over cooled or chilled rollers 1035 at each end and in cooling vacuum chambers 1031B following deposition vacuum chambers 1031A. A slurry spray 1037 may spray slurry in the first vacuum chamber 1031A. An insulation spray 1039 may spray insulation in second vacuum chamber 1031A. Stainless steel substrate deposition belt 1034 may exit multicompartment vacuum chamber 1044 through vacuum seal 1036 and may come off deposition belt 1034 as continuous Graphene/insulation strip 1033. Deposition belt 1034 may return after first being cleaned by a belt scrapper 1041 (e.g., scraper).

Figure 11:
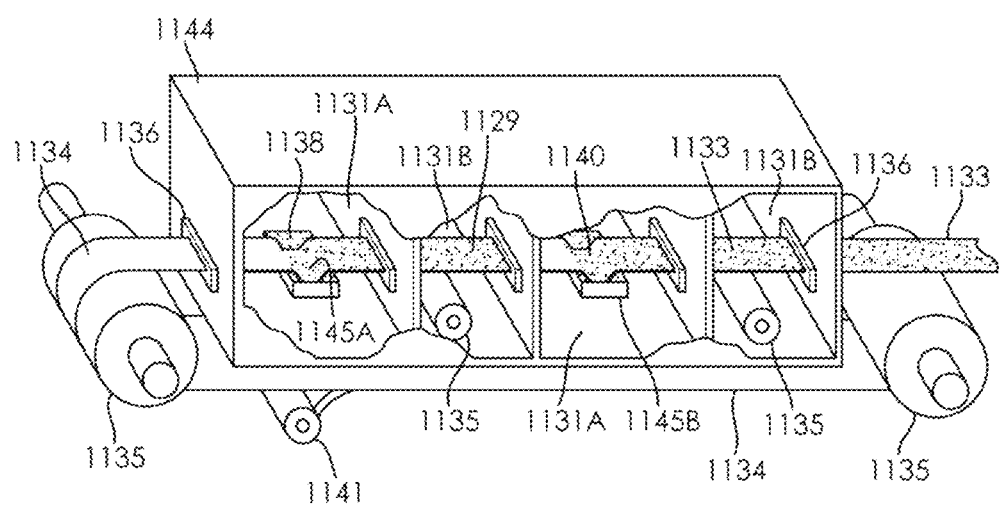
FIG. 11 depicts an alternative method and apparatus to fabricate exemplary Graphene and insulation strips using a multicompartment vacuum chamber.

FIG. 11 depicts an alternative exemplary method and apparatus for fabricating at least some exemplary embodiments of Graphene and insulation strips using a multicompartment vacuum chamber. FIG. 11 illustrates an exemplary fabrication method of a Graphene and insulation strip 1133, using a multicompartment vacuum chamber 1144. A belt (e.g., continuous stainless steel substrate deposition belt 1134) may run through vacuum chamber 1144 having a plurality of vacuum seals 1136 (e.g., a vacuum seal 1136 for each compartment). Stainless steel substrate deposition belt 1134 may run over cooled or chilled rollers 1135 at each end and in cooling vacuum chambers 1131B following deposition vacuum chambers 1131A. A slurry tank 1145A having Graphene slurry 1138 may allow for the application or deposition of slurry on Graphene strip (e.g., Graphene strip 1129) in first vacuum chamber 1131A (e.g., by passing belt 1134 through slurry tank 1145A). An insulation tank 1145B having insulation liquid 1140 may allow for the application or deposition of insulation on Graphene and insulation strip 1133 (e.g., strip 1129 may be designated as strip 1133 after deposition or application of insulation) in second vacuum chamber 1131A (e.g., by passing belt 1134 through insulation tank 1145B having insulation material). Stainless steel substrate deposition belt 1134 may exit multicompartment vacuum chamber 1144 through vacuum seal 1136 and may come off deposition belt 1134 as continuous Graphene/insulation strip 1133. Deposition belt 1134 may return after first being cleaned by a belt scrapper 1141 (e.g., scraper).

Figure 12A:
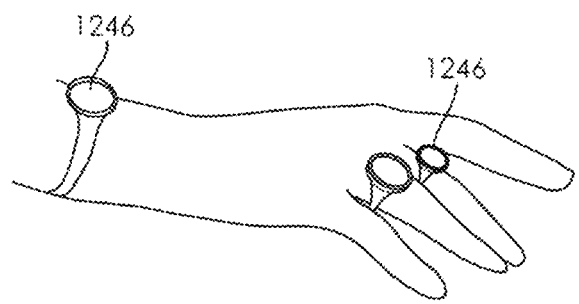
FIGS. 12A and 12B depict exemplary applications of embodiment LED assemblies.
Figure 12B:
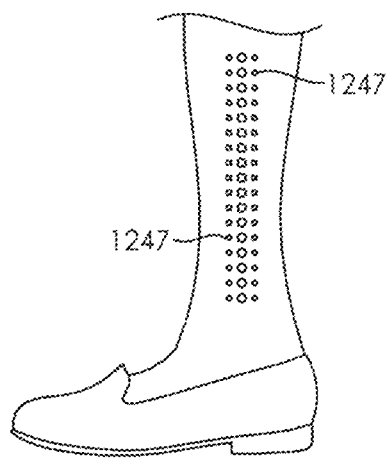

FIGS. 12A and 12B illustrate exemplary embodiments of jewelry and clothing LED assemblies. FIG. 12A illustrates a plurality of LED assemblies 1246 that may be jewelry (e.g., costume gemstones such as on rings or bracelets). FIG. 12B illustrates a plurality of LED assemblies 1247 that may also be jewelry (e.g., ornamentation disposed on clothing such as shoes, boots, pants, or stockings).

Figure 13:
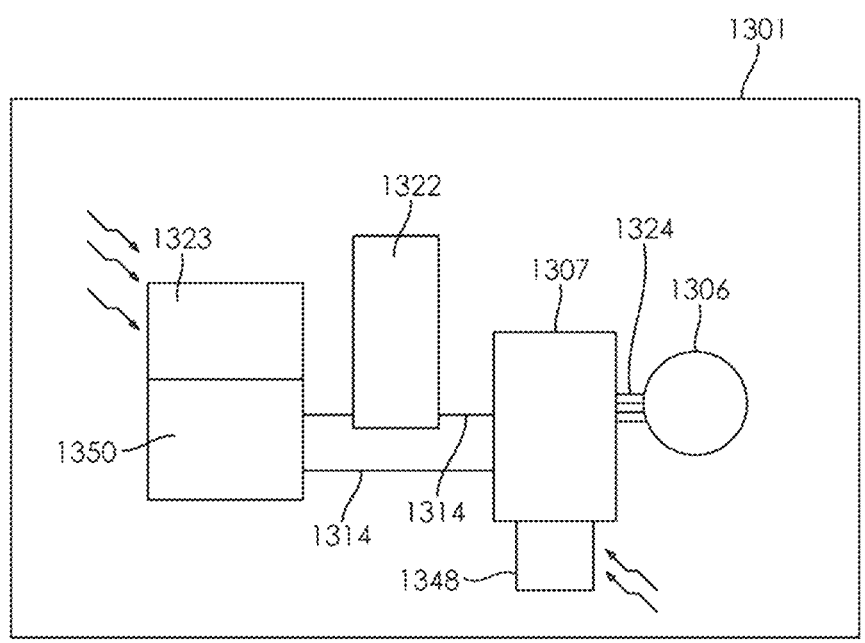
FIG. 13 depicts an exemplary harvested energy powered LED assembly remote control circuit.

FIG. 13 illustrates an exemplary embodiment of a harvested energy powered LED assembly remote control circuit. FIG. 13 illustrates a circuit block diagram within an LED assembly 1301. Power may be received wirelessly via a receiving coil 1323 from either Wi-Fi radiation (e.g., and/or radiofrequency electromagnetic radiation) from any number of Wi-Fi sources (e.g., and/or radiofrequency electromagnetic radiation sources) nearby, or purposely produced for the exemplary assembly with that energy being passed on to a tuning and converting circuitry 1350 using Energy Harvesting components. The energy may be passed to a battery 1322 and on to a controlling section 1307 (e.g., via power leads 1314), which may be controlled by (e.g., may receive its commands from) a remote control via a sensor section 1348. A signal may then be sent to an LED 1306 via LED leads 1324, which may result in the suitable illumination displays.

Figure 14:
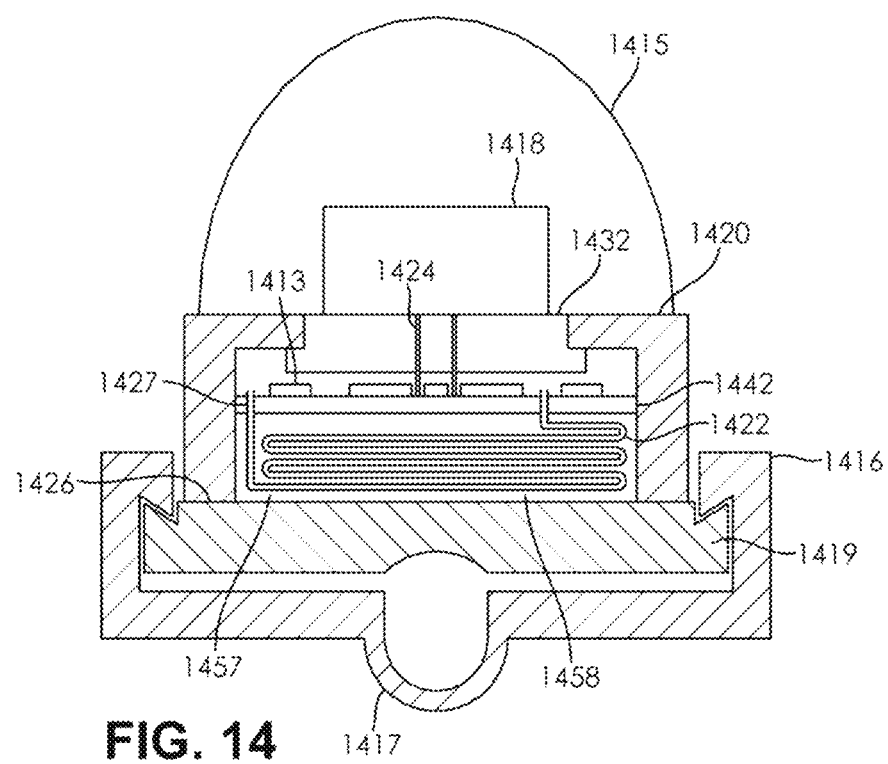
FIG. 14 depicts an additional exemplary embodiment of the present disclosure.

FIG. 14 illustrates a cross sectional view of an exemplary LED assembly having an LED lens covering an LED. An LED lens 1415 may cover an LED 1418. Leads 1424 may connect to LED 1418 through an opening in a heat sink 1432 on which LED 1418 is mounted to a circuit board 1442. Circuit board 1442 may include frequency tuning, Wi-Fi receiver components, circuitry 1413, and/or function controls. Circuit board 1442 may be connected to a Graphene and cellulose insulator stack battery 1422 (e.g., via battery leads 1427). Lens 1415 may be mounted on a housing 1420 that may be bonded to a base 1419 by a bond 1426 (e.g., bonding material) and a mounting clip 1417 including a portion 1416 that may receive the LED assembly. Stack battery 1422 may be relatively wide and thin and may include an antenna 1457 (e.g., a multi-level antenna, e.g. a fractural antenna) disposed below stack battery 1422 and surrounded by insulation 1458 (e.g., any suitable insulation material). Antenna 1457 may for example collect energy transferred by an exemplary disclosed Wi-Fi and/or RF source (e.g., as described for example herein). Stack battery 1422 and antenna 1457 may be connected to circuit board 1442 that contains circuitry 1413 to harvest the energy collected by the multifrequency receiving fractural antenna 1457 and stored in the Graphene battery stack 1422 that may be used to power LED 1418 (e.g., when requested by a remote-control unit). Antenna 1457 may have a relatively small antenna design may have any suitable shape (e.g., of a plurality of pattern shapes). For example, antenna 1457 may have a shape that provides for a relatively large range of frequencies to be received simultaneously (e.g., thereby allowing a relatively large amount of weak energy signals to be harvested and stored in the Graphene battery stack 1422).

Figure 15:
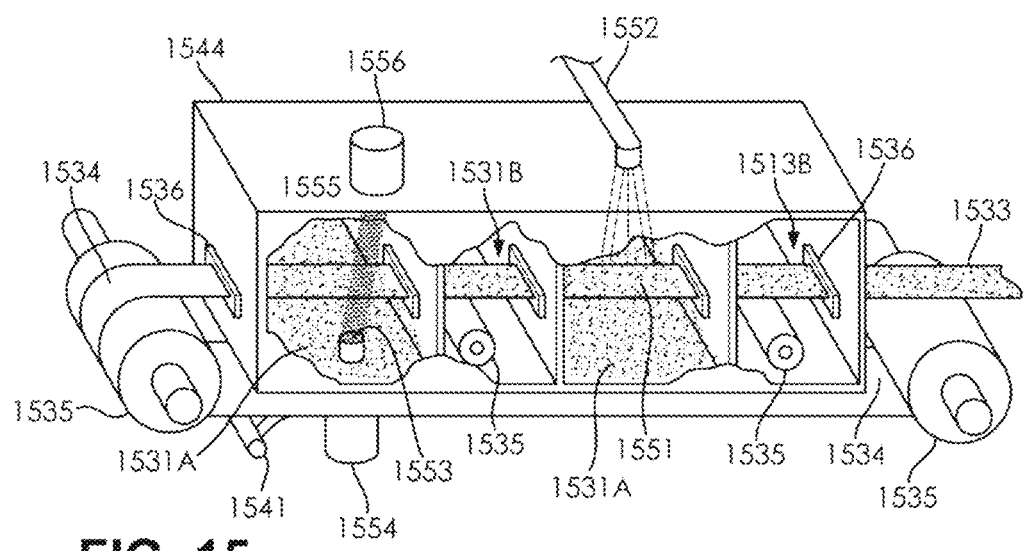
FIG. 15 depicts an additional exemplary embodiment of the present disclosure.

FIG. 15 illustrates an exemplary method and apparatus for fabricating at least some exemplary embodiments of an insulated Graphene sheet. This exemplary process may use an electron beam method for vaporizing graphite in a vacuum chamber for deposition on a stainless-steel belt using a multicompartment vacuum chamber. FIG. 15 illustrates an exemplary fabrication method of a Graphene and insulation strip 1533, using a multicompartment vacuum chamber 1544. A belt (e.g., continuous stainless steel substrate deposition belt 1534) may run through vacuum chamber 1544 having a plurality of vacuum seals 1536 (e.g., a vacuum seal 1536 for each compartment). Stainless steel substrate deposition belt 1534 may run over cooled or chilled rollers 1535 at each end and in cooling vacuum chambers 1531B following for example deposition vacuum chambers 1531A. A graphite rod 1553 may be fed from below (e.g., from graphite rod feeder 1554) up into first vacuum chamber 1531A and may be vaporized by an electron beam 1555 (e.g., provided by an electron gun 1556) operating at a suitable intensity to vaporize the Graphene to provide a mist for gravitational disposition. Parylene vapor 1551 (e.g., parylene vapor feed) produced by vaporization and pyrolysis equipment 1552 (e.g., including a heated vaporized feed tube) may provide insulation material (e.g., Parylene insulation material) to strip 1533 in second vacuum chamber 1531A. Stainless steel substrate deposition belt 1534 may exit multicompartment vacuum chamber 1544 through vacuum seal 1536 and may come off deposition belt 1534 as continuous Graphene/insulation strip 1533. Deposition belt 1534 may return after first being cleaned by a belt scrapper 1541 (e.g., scraper).

In at least some exemplary embodiments, the exemplary LED assemblies may have highly efficient storage capability provided in a small space, and may include micro circuitry for capture from a tuned receiving coil or Fractural antenna. The control circuitry may receive a control signal from a remote source and may command the exemplary LED assembly to illuminate a single or multi-color LEDs for specific displays.

In at least some exemplary embodiments, the exemplary disclosed manufacturing processes may provide vapor deposition for insulated Graphene sheets/ribbons. In at least some exemplary embodiments, the exemplary disclosed apparatus and method may include the use of insulated Graphene strips in LED assemblies.

Although various embodiments have been described with reference to the Figures, other embodiments are possible. For example, in at least some exemplary embodiments, LEDs may be used in many applications. In an illustrative example, some LEDs may be powered by rectified AC or a variety of low voltage wired sources. In various examples, LEDs may be powered by batteries that may be replaced or recharged by a wired power connection. Various embodiments may solve problems such as difficulty involved in untangling LED strings after storage, by not being connected to a wire string on part of a physically connected device. In some embodiments, exemplary LEDs may obtain their power from wireless sources on a constant basis, storing energy when they are not in use, to use when the energy is needed. Also, in some embodiments, the LEDs may be moved and/or reorganized without regard to attachment requirements.

In at least some exemplary embodiments, the exemplary disclosed apparatus may be reduced in size to provide desired battery technology. For example, the exemplary disclosed batteries may be of suitable (e.g., relatively small) size to be configured with a single LED and to provide energy to last for a reasonable time before recharging and or replacement.

In at least some exemplary embodiments, Graphene Capacitor/Batteries of suitable size (e.g., relatively small size) may be manufactured to provide adequate energy to last for a suitable or reasonable time. At least some exemplary embodiments may include a method to manufacture a Graphene battery. At least some exemplary embodiments may include manufacturing techniques for the fabrication of Graphene/insulation strips included in the exemplary disclosed capacitor/battery.

At least some exemplary embodiments may harvest energy in the air (for example, Wi-Fi- and/or RF energy) and store the harvested energy in a battery to power an individual LED. In at least some exemplary embodiments, the exemplary disclosed battery may permit increased charge storage in a relatively small (e.g., very small) battery. In at least some exemplary embodiments, the relatively smaller battery design may allow the entire LED assembly to be small. In at least some exemplary embodiments, tiny batteries including a timer may be fabricated and utilized.

In at least some exemplary embodiments, the exemplary disclosed apparatus may include a lighting component (e.g., LED 518, LED 718, and LED 1418); an energy storage assembly (e.g., battery stack 522, battery stack 622, battery stack 723, battery 823, battery 923, and stack battery 1422) electrically connected to the lighting component; a control assembly (e.g., circuit board 542, circuit board 742, and circuit board 1442) electrically connected to the energy storage assembly; and an energy receiving component (e.g., receiving coil 521, receiving coil 721, and antenna 1457) electrically connected to the control assembly. The energy receiving component may wirelessly receive energy. The energy storage assembly may include a Graphene strip. The energy storage assembly may be a Graphene stack battery and the Graphene strip may be a folded Graphene strip or a coiled Graphene strip. The Graphene strip may be a single atom Graphene strip that is folded in a stack configuration. The energy storage assembly may include the Graphene strip and an insulator strip that are folded together in a stack configuration. The insulator strip may be a cellulose strip. The lighting component may be an LED, the control assembly may be a circuit board, and the energy receiving component may be a coil. The energy receiving component may be selected from the group consisting of a coil and a multi-level antenna. The energy receiving component may be a fractural antenna. The energy storage assembly may be a capacitor coil formed from the Graphene strip, which may be a one atom thick Graphene strip, and a one atom thick insulator strip. The lighting component may be a holiday decoration LED or a costume jewelry LED.

In at least some exemplary embodiments, the exemplary disclosed method may include providing a multicompartment assembly including a first deposition vacuum chamber (e.g., chamber 1031A, chamber 1131A, and chamber 1531A), a first cooling vacuum chamber (e.g., chamber 1031B, chamber 1131B, and chamber 1531B), a second deposition vacuum chamber (e.g., chamber 1031A, chamber 1131A, and chamber 1531A), and a second cooling vacuum chamber (e.g., chamber 1031B, chamber 1131B, and chamber 1531B), passing a belt through the first deposition vacuum chamber, the first cooling vacuum chamber, the second deposition vacuum chamber, and the second cooling vacuum chamber, and depositing Graphene on the belt as the belt passes through the first deposition vacuum chamber. The exemplary disclosed method may also include cooling the deposited Graphene on the belt as the belt passes through the first cooling vacuum chamber, depositing insulation material on the cooled deposited Graphene on the belt as the belt passes through the second deposition chamber, and cooling the deposited insulation material on the cooled deposited Graphene on the belt as the belt passes through the second cooling vacuum chamber. Depositing Graphene on the belt may be selected from the group consisting of spraying slurry on the belt, passing the belt through a slurry tank, and vaporizing a graphite rod using an electron beam to provide a mist to deposit Graphene on the belt. Depositing insulation material on the cooled deposited Graphene on the belt may be selected from the group consisting of spraying insulation on the belt, passing the belt through an insulation material tank, and providing Parylene vapor to the belt. Cooling the deposited Graphene on the belt may include running the belt over cooled rotatable rollers. Cooling the deposited insulation material on the cooled deposited Graphene on the belt may include running the belt over cooled rotatable rollers. The exemplary disclosed method may also include removing the cooled insulation material deposited on the cooled Graphene from the belt that is a stainless steel belt.

In at least some exemplary embodiments, the exemplary disclosed apparatus may include a lighting assembly including an LED (e.g., LED 518, LED 718, and LED 1418), an energy storage assembly (e.g., battery stack 522, battery stack 622, battery stack 723, battery 823, battery 923, and stack battery 1422) electrically connected to the LED, a control assembly (e.g., circuit board 542, circuit board 742, and circuit board 1442) electrically connected to the energy storage assembly, and an energy receiving component (e.g., receiving coil 521, receiving coil 721, and antenna 1457) electrically connected to the control assembly; and an energy source. The energy receiving component may wirelessly receive energy from the energy source. The energy storage assembly may include a strip that is either folded or coiled. The energy source may be a Wi-Fi radiation source. The exemplary disclosed apparatus may also include a control circuit that controls the lighting assembly to selectively operate the LED. The LED may be an illuminated artificial tree light.

In at least some exemplary embodiments, the exemplary disclosed apparatus and method may include harvested energy powered LED lighting elements such as candles. For example as illustrated in FIGS. 16-20, the exemplary disclosed lighting elements that may be energy harvesting LEDs (e.g., "Fi-Lites") may be LED candles that are included on a Holiday structure such as a Christmas tree or may be stand-alone LED candles. The exemplary disclosed lighting element may include a Graphene battery or any other suitable high energy storage battery that may be included in a lighting configuration including a variety of coil, RF, Wi-Fi, and other suitable source signals with RC circuits or other suitable circuits. The exemplary disclosed lighting element may capture free air electrical energy and store that energy in a fast-charging and slow-discharging battery such as the exemplary disclosed Graphene batteries and/or other suitable high energy storage battery.

Figure 16:
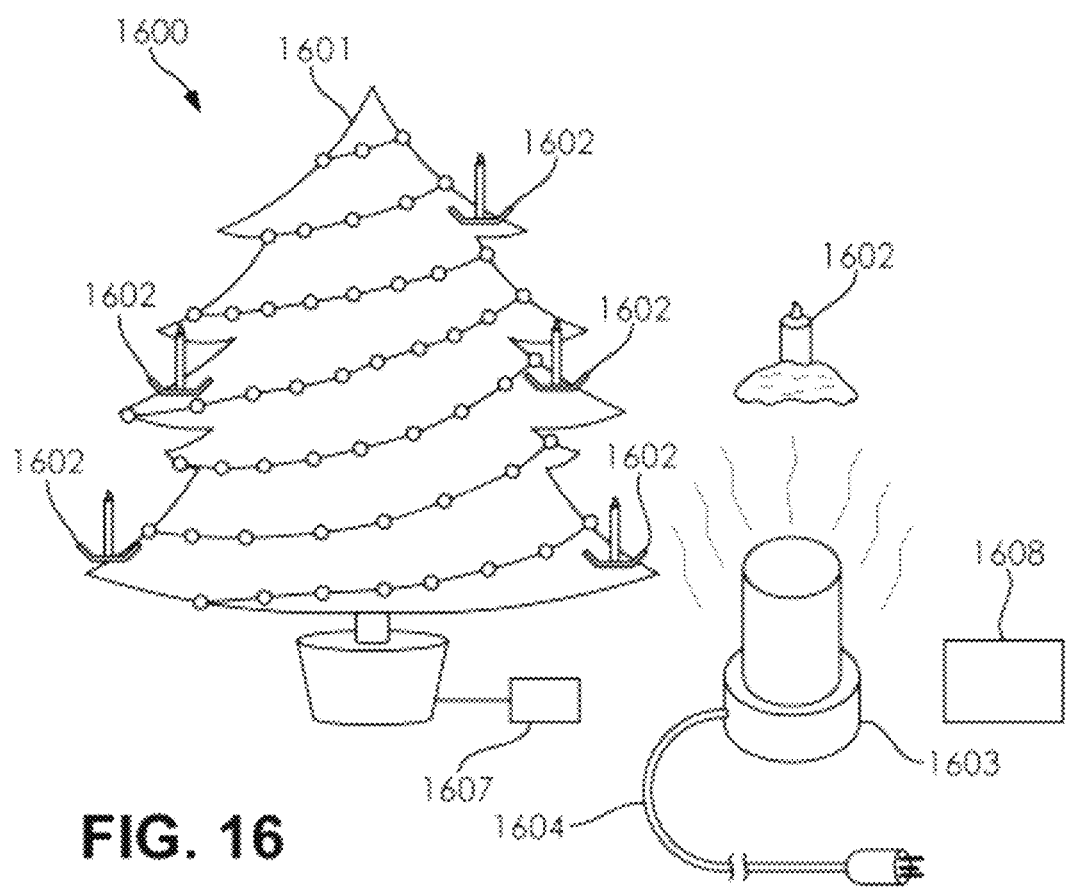
FIG. 16 depicts an additional exemplary embodiment of the present disclosure.

FIG. 16 illustrates a system 1600 that may include a structure 1601 that may support lighting elements. For example, structure 1601 may be a decorative structure or assembly such as a Christmas tree or table center piece. A plurality of lighting assemblies 1602 may be supported by and/or attached to structure 1601. In at least some exemplary embodiments, lighting assembly 1602 may be a holiday decoration such as an LED candle assembly. A user may place (e.g., attach) lighting assemblies 1602 at desired positions of structure 1601 using attachment assemblies of lighting assemblies 1602 for example as described below.

System 1600 may also include a source of energy 1603 that may be similar to source of energy 103. For example, source of energy 1603 may be any suitable Wi-Fi/RF energy source device such as a wireless Wi-Fi/RF device. Source of energy 1603 may be connected to a power source such as an electrical outlet via a power cord 1604 that may be similar to power cord 104. A user may control components of system 1600 via a remote control device 1608. Remote control device 1608 may be similar to remote control device 208. Remote control device 1608 may send signals for control of lighting assemblies 1602 to a control receiver 1607 (e.g., an LED assembly receiver). Control receiver 1607 may be disposed at or near a base portion (e.g., a tree base) of structure 1601 or attached to structure 1601. Control receiver 1607 may receive function signals from remote control device 1608 based on input provided to remote control device 1608 by a user.

Figure 17:
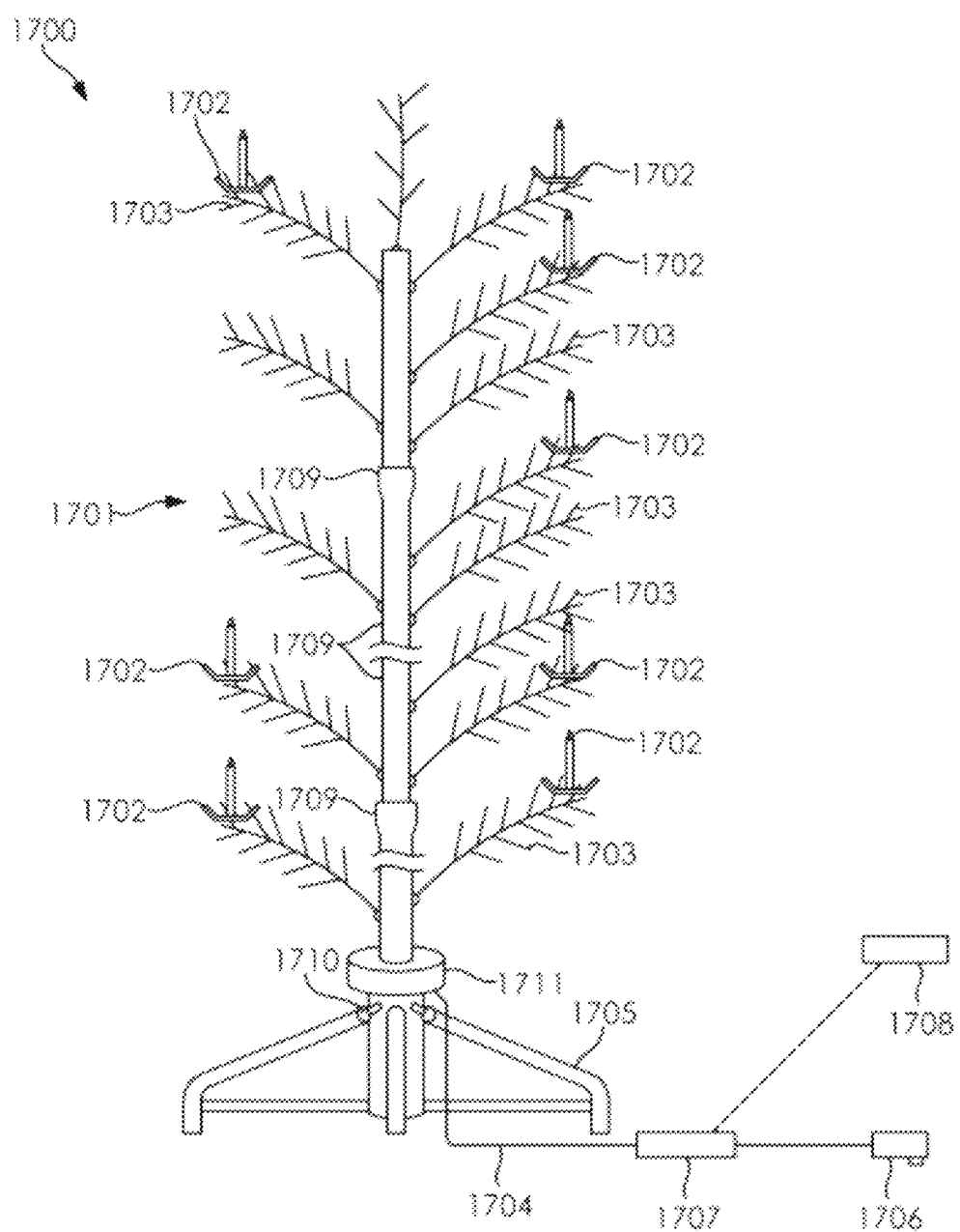
FIG. 17 depicts an additional exemplary embodiment of the present disclosure.

FIG. 17 illustrates another exemplary embodiment of the exemplary disclosed apparatus and method. System 1700 may include a structure 1701 (e.g., an artificial decorative tree such as a Christmas tree) that may be similar to structure 1601. Structure 1701 may include a plurality of sections 1709 that may be for example tree sections. Each section 1709 may include a plurality of members 1703 that may be for example branches of structure 1701 that may be an artificial tree. A plurality of lighting assemblies 1702 that may be similar to lighting assemblies 1602 may be mounted or attached to members 1703. Structure 1701 may also include an assembly 1705 that may be similar to tree stand 205. Assembly 1705 may include one or more fasteners 1710 (e.g., tree stand securing bolts 210) that may be similar to bolts 210. Structure 1701 may include a housing 1711 (e.g., a Wi-Fi or RF transmitter housing) that may be similar to housing 211. Housing 1711 may be powered (e.g., receive its power) via a power cord 1704 (e.g., a wire cable) that may be similar to power cord 1604 and that may be connected to a control receiver 1707 that may be similar to control receiver 1607. Control receiver 1707 may receive power from a voltage adapter 1706 that may be similar to voltage adapter 206. Voltage adapter 1706 may connect to a power source (e.g., plug into a socket such as a household power socket). Control receiver 1707 may receive function signals from a remote control device 1708 that may be similar to remote control device 1608. Housing 1711 may include (e.g., contain or house) a transmitter that may transmit power wirelessly up structure 1701 to lighting assemblies 1702 (e.g., LED candle light assemblies) mounted on members 1703 of sections 1709.

Figure 18:
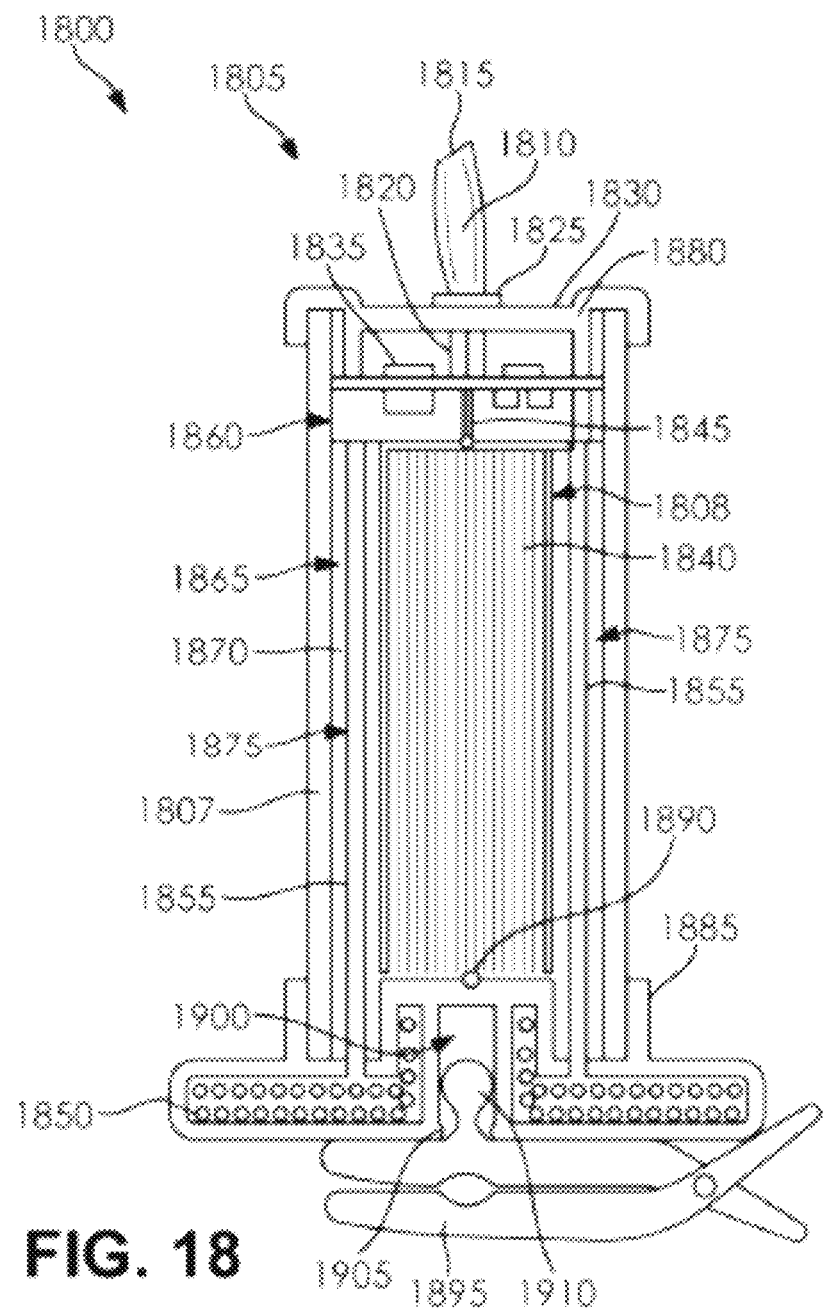
FIG. 18 depicts an additional exemplary embodiment of the present disclosure.

FIG. 18 illustrates a cross-sectional view of another exemplary embodiment of the exemplary disclosed apparatus and method. System 1800 may include an apparatus 1805 that may be a decorative assembly such as a candle assembly (e.g., an LED candle assembly). Apparatus 1805 may be included in systems 1600 and/or 1700 as an alternative to and/or in addition to lighting assemblies 1602 and 1702 (e.g., and operate similarly to lighting assemblies 1602 and 1702).

Apparatus 1805 may include one or more (e.g., a plurality such as two, three or more) lighting assemblies 1810. Apparatus 1805 may include a housing 1807 that contains components of system 1800 as described for example below. Lighting assemblies 1810 may be disposed within a housing 1815 that may be a transparent or translucent housing (e.g., a colored or clear plastic or glass housing). For example, housing 1815 may be a flame-shaped clear plastic or glass cap. Lighting assemblies 1810 may include leads 1820 that may extend through an aperture (e.g., an opening) of a heat sink 1825 that may be mounted to an assembly portion 1830. Assembly portion 1830 may be an LED socket or candle top. Leads 1820 may connect to a circuit board 1835.

Lighting assemblies 1810 may be single or dual flicker lighting assemblies (e.g., single or dual flicker flame LEDs). For example, lighting assembly 1810 may be a flickering LED that may represent or simulate a flame. In at least some exemplary embodiments, apparatus 1805 may include a single LED or a plurality of LEDs (e.g., two LEDs) arranged in a side-by-side configuration. One or more lighting assemblies 1810 may be LEDs that may be energized in a way to simulate a moving flame.

Circuit board 1835 may be any suitable circuit board such as a double-sided board (e.g., a double-sided electronics board). Circuit board 1835 may be disposed within a cavity 1808 of housing 1807. Circuit board 1835 may include frequency tuning components, Wi-Fi receiver components, and/or function controls. Circuit board 1835 may be connected to a power storage 1840 via a battery lead 1845. Power storage 1840 may be disposed in cavity 1808. Power storage 1840 may be a high-efficiency Graphene battery. For example, power storage 1840 may be similar to Graphene and cellulose insulator stack battery 522. Circuit board 1835 may also connect to a receiving coil 1850 (e.g., an energy harvesting coil) via coil connecting leads 1855. Receiving coil 1850 may be similar to receiving coil 521.

Circuit board 1835 may be held in place at a top portion of apparatus 1805 by a spacer 1860 that may be disposed below circuit board 1835. Spacer 1860 may be an insulation spacer ring. Spacer 1860 may rest on or abut a top portion of an insulation member 1865 that may be disposed within housing 1807 and/or may be an integral part of housing 1807. For example, insulation member 1865 may form part or substantially all of housing 1807. For example, spacer 1860 may rest on ribs 1870 of housing 1807 (e.g., including insulation member 1865). Protrusions 1880 disposed at a lower portion of assembly portion 1830 may also support circuit board 1835 (e.g., hold circuit board 1835 in place within housing 1807 and/or insulation member 1865).

Housing 1807 (e.g., including insulation member 1865) may be an insulation tube (e.g., candle insulation tube). Ribs 1870 may include (e.g., or form) one or more cavities 1875 (e.g., elongated cavities). For example, cavities 1875 may be lead channels formed in housing 1807 (e.g., including insulation member 1865) that may be an insulation tube. Leads of apparatus 1805 such as coil connecting leads 1855 may extend through cavities 1875. Cavities 1875 may extend from cavity 1808 toward a periphery of housing 1807 (e.g., between ribs 1870) and/or may be cavities formed within ribs 1870 (e.g., cavities 1875 may be separated from cavity 1808 by wall portions of ribs 1870).

In at least some exemplary embodiments, housing 1807 (e.g., including insulation member 1865 that may be an integral part of housing 1807) may be an insulating tube having ribs 1870 that form or include cavities 1875 that may act as channels through which leads may extend. For example, coil connecting leads 1855 may extend through cavities 1875. Also for example, battery leads 1845 may extend through cavities 1875 from an upper portion of apparatus 1805 (e.g., at and/or adjacent to circuit board 1835) to terminal connection 1890 that may be disposed at a lower portion of apparatus 1805 at or near a base assembly 1885. For example, terminal connection 1890 may be a battery terminal connection that is connected to circuit board 1835 via battery leads 1845 (e.g., that may extend or run through cavities 1875).

One or more receiving coils 1850 may be disposed in (e.g., within) a cavity of base assembly 1885. Base assembly 1885 may be attached to housing 1807 (e.g., including insulation member 1865). For example, base assembly 1885 and housing 1807 may include corresponding protrusions and/or recesses that may fit together so that base assembly 1885 and housing 1807 may be removably attached or fixedly attached to each other.

The exemplary electronic components disclosed above may allow for one or more lighting assemblies 1810 to be controlled based on predetermined time periods of operation. For example, one or more lighting assemblies 1810 may be controlled (e.g., independently controlled of each other) to operate using a 6-hour (e.g., or any other desired time period) "on" timer allowing for operation and an 18-hour (e.g., or any other desired time period) "off" timer allowing system 1800 to recharge one or more lighting assemblies 1810 (e.g., based on receiving coil 1850 receiving energy and charging power storage 1840). For example, apparatus 1805 may thereby capture small amounts of energy during the 18-hour "off" time period to be used during the 6-hour "on" time period.

Apparatus 1805 may be removably attached to an attachment assembly 1895. Attachment assembly 1895 may be any suitable attachment device such as a clip, clamp, hook and loop fastener, adhesive fastener, or any other suitable fastening device. For example, attachment assembly 1895 may removably attach apparatus 1805 to any desired object such as member 1703 (e.g., a tree branch) or any other suitable object or structure (e.g., a decorations surface, furniture, portion of a window, portion of a structure such as a building, outdoor objects such as trees, or any other desired location). Base assembly 1885 may include a cavity 1900 that may be formed from protrusion, recesses, and/or other portions of base assembly 1885 (e.g., at a lower side or portion of base assembly 1885). For example, cavity 1900 may be a snap-in cavity having an aperture formed in a bottom surface of base assembly 1885. Base assembly 1885 may also include a member 1905 that may be disposed within or adjacent to cavity 1900. Member 1905 may be a member that may be molded into cavity 1900. For example, member 1905 may be a detention ring that may be molded into cavity 1900. Member 1905 may be shaped or configured to receive a protrusion 1910 of attachment assembly 1895. Protrusion 1910 may be for example an elliptical or spherical shaped protrusion or knob that may be pressed through an aperture of member 1905 and received within cavity 1900. Member 1905 may be formed from any suitable flexible material for removably receiving protrusion 1910 such as, for example, rubber, elastomeric material, soft plastic material, and/or any other suitable material that may stretch to receive and retain protrusion 1910. In at least some exemplary embodiments, attachment assembly 1895 may be a clip that may attach apparatus 1805 that may be an LED candle decoration to structures (e.g., structure 1601 or structure 1701) such as artificial Christmas trees. Apparatus 1805 may be removably attached to attachment assembly 1895 (e.g., that may be attached to a decoration as described above) via protrusion 1910 being removably received via member 1905 and cavity 1900. A multiplicity of candle LED arrangements may thereby be provided by any desired number of systems 1800 for any desired event or religious holiday. Components of apparatus 1805 and attachment assembly 1895 may be formed from any suitable material such as, for example, plastic, metal, composite material, wood, or any other suitable structural material.

Figure 19:
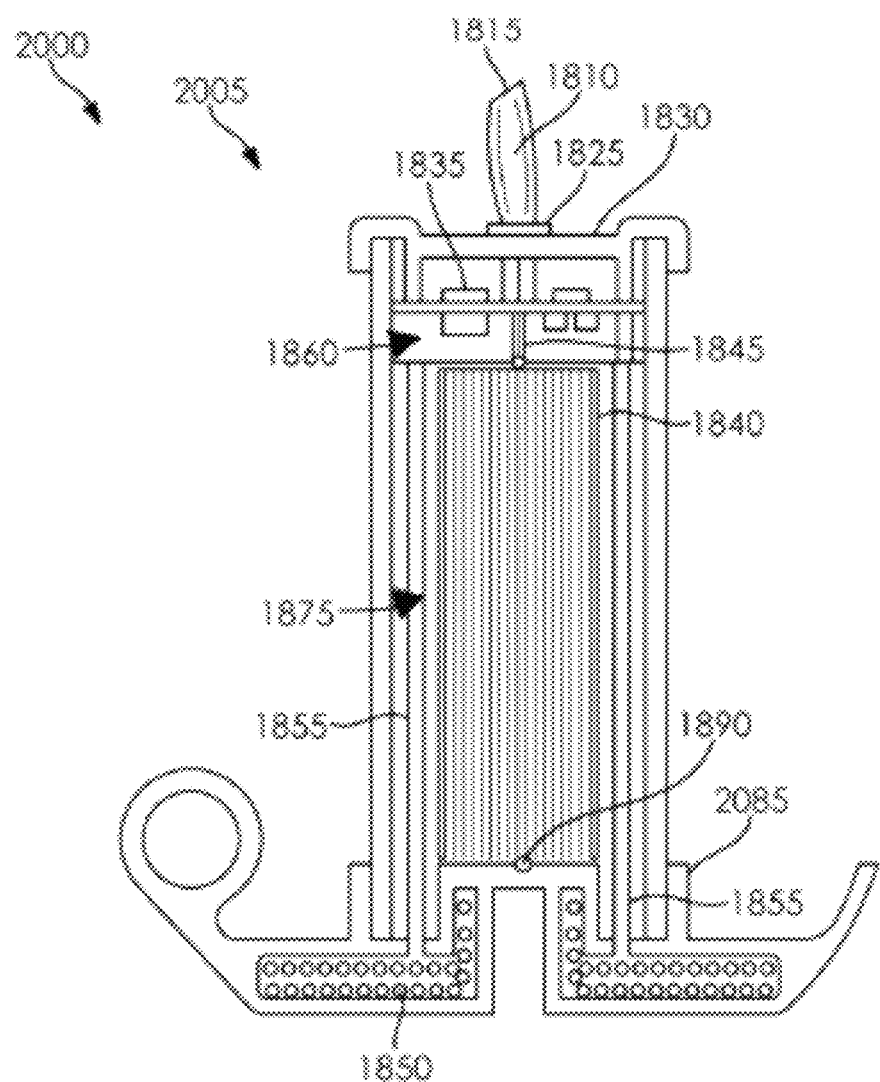
FIG. 19 depicts an additional exemplary embodiment of the present disclosure.

FIG. 19 illustrates a cross-sectional view of another exemplary embodiment of the exemplary disclosed apparatus and method. System 2000 may include an apparatus 2005 that may be generally similar to apparatus 1805. Apparatus 2005 may include a base assembly 2085 that may be generally similar to base assembly 1885. Base assembly 2085 may have a shape of a candle holder (e.g., candle-holder-shape such as a traditional holiday candle holder). Base assembly 1885 may also have a similar shape as base assembly 2085. Apparatus 2005 is shown as detached from an exemplary disclosed attachment assembly (e.g., that may be similar to attachment assembly 1895). For example, base assembly 2085 may have a substantially flat bottom surface so that apparatus 2005 may be placed on a surface such as a table, windowsill, or other flat surface (e.g., when not removably attached to an object such as attachment assembly 1895 and member 1703).

Figure 20:
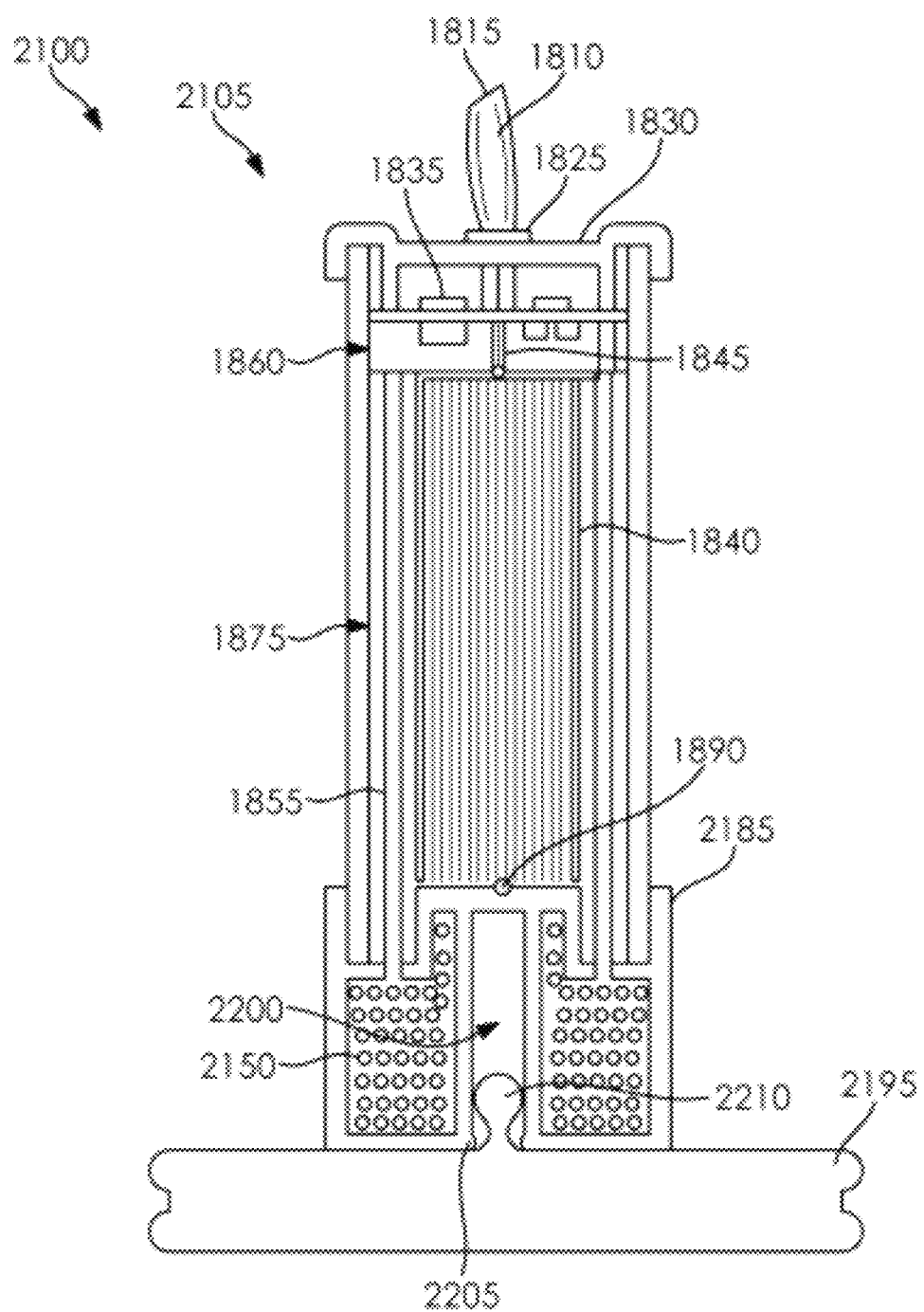
FIG. 20 depicts an additional exemplary embodiment of the present disclosure.

FIG. 20 illustrates a cross-sectional view of another exemplary embodiment of the exemplary disclosed apparatus and method. System 2100 may include an apparatus 2105 that may be generally similar to apparatus 1805. System 2100 may include a base assembly 2185 that may be generally similar to base assembly 1885. A receiving coil 2150 that may be generally similar to receiving coil 1850 may be disposed in or within a cavity of base assembly 2185. Base assembly 2185 may include a cavity 2200 and a member 2205 that may be similar to member 1905. Apparatus 2105 may be removably attachable to an attachment assembly 2195. A protrusion 2210 of attachment assembly 2195 that may be similar to protrusion 1910 may be removably received by member 2205 and cavity 2200 (e.g., similar to how protrusion 1910 may be removably received by member 1905 and cavity 1900). Attachment assembly 2195 may be any suitable support structure such as a support structure for a plurality of systems 2100 (e.g., a plurality of LED candles). Attachment assembly 2195 may have any suitable shape or configuration such as, for example, a circular shape, or a stepped shape (e.g., stair-step configuration). Also for example, attachment assembly 2195 may be a candelabra, a chandelier, a light post, or any other suitable structure for supporting one or more systems 2100 (e.g., that may be LED candles).

Figure 21:
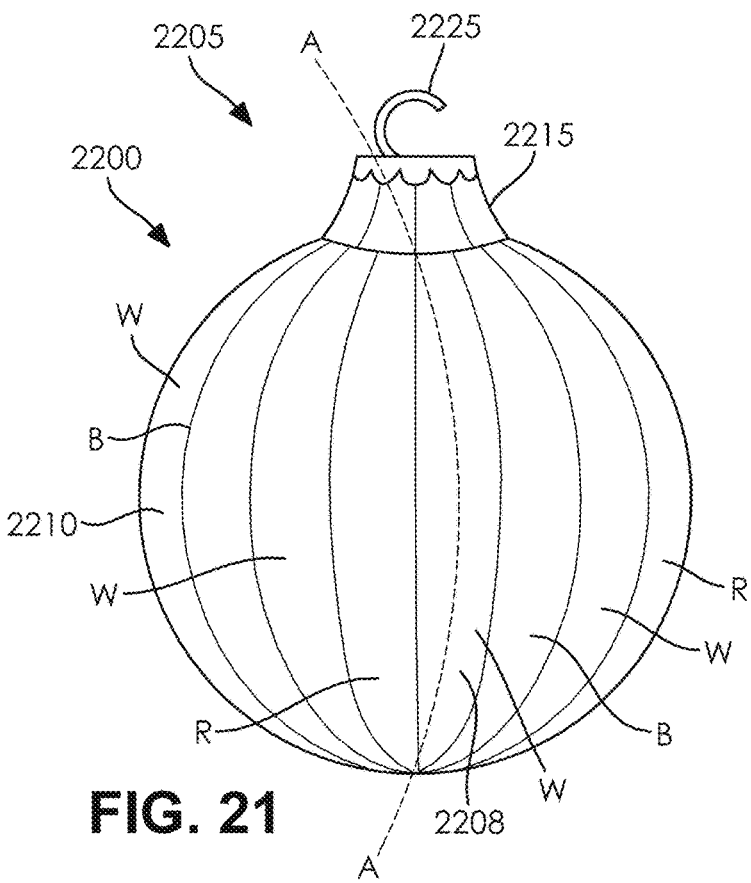
FIG. 21 depicts an additional exemplary embodiment of the present disclosure.
Figure 22:
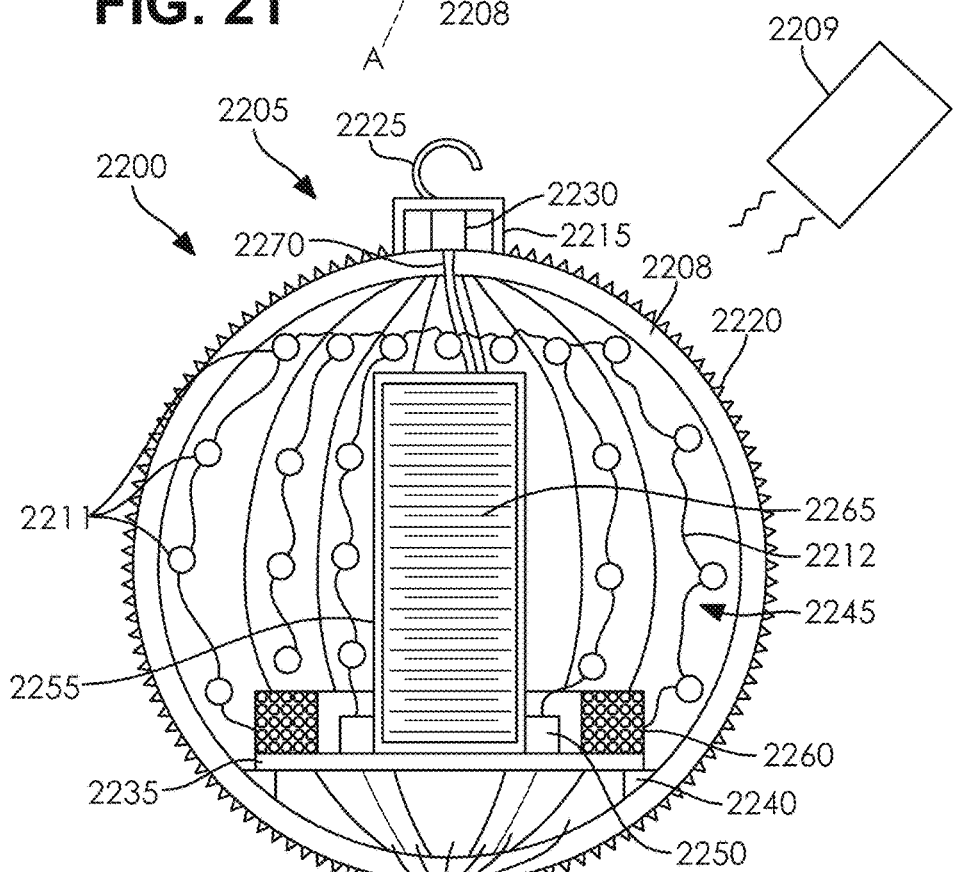
FIG. 22 depicts an additional exemplary embodiment of the present disclosure.

FIGS. 21 and 22 illustrate another exemplary embodiment of the exemplary disclosed apparatus and method. System 2200 may include an apparatus 2205 that may be a decorative assembly such as an ornament assembly (e.g., an LED holiday ornament assembly such as a Christmas ornament). For example, apparatus 2205 may be a ball-shaped or elliptical-shaped ornament (e.g., a ball ornament). FIG. 21 illustrates a side view of apparatus 2205. FIG. 22 illustrates a sectional view A-A of apparatus 2205 taken through line A-A of FIG. 21. Apparatus 2205 may be included in systems 1600 and/or 1700 as an alternative to and/or in addition to lighting assemblies 1602 and 1702 (e.g., and operate similarly to lighting assemblies 1602 and 1702).

As illustrated in FIGS. 21 and 22, apparatus 2205 may include a plurality of lighting assemblies 2210. Lighting assembly 2210 may include one or more lighting elements 2211 such as LED lighting elements, incandescent lighting elements, and/or any other suitable lighting element. Lighting elements 2211 may be electrically connected via one or more electrical connectors 2212 (e.g., LED wiring). For example, lighting assembly 2210 may be an LED color stripe. As illustrated in FIG. 21, a plurality of lighting assemblies 2210 may be disposed along an exterior of apparatus 2205 as segmented exterior color stripes. For example, each lighting assembly 2210 may form a segment of a segmented exterior of apparatus 2205. For example as illustrated in FIG. 21, lighting assemblies 2210 may include white ("W") LEDs, blue ("B") LEDs, red ("R") LEDs, and/or any other desired color (e.g., green, yellow, and/or violet). A plurality of lighting elements 2211 (e.g., LED lighting elements) may form each lighting assembly 2210 (e.g., stripe). Lighting assembly 2210 may include lighting elements 2211 of different colors. Lighting assembly 2210 may be multi-colored lighting assemblies that may change color (e.g., based on control by a remote control device 2209 that may be included in system 2200). Remote control device 2209 may be similar to remote control device 1608. Remote control device 2209 may be for example a remote control configured specifically to control system 2200 or any suitable user device (e.g., a smart device such as a smartphone or tablet). For example, lighting assemblies 2210 may change color between a pattern of colors in a rotating (e.g., "chasing") manner. For example, adjacent lighting assemblies 2210 may change color in a coordinated manner so that a given pattern of color may appear to move between adjacent lighting assemblies 2210 to give apparatus 2205 a rotating effect to viewers (e.g., may give the perception of rotating). For example, each of a plurality of lighting assemblies 2210 may be selectively operated to independently light each corresponding segment to be a desired color to provide a chasing effect in which the desired color is displayed in succession across adjacent segments.

Lighting assemblies 2210 may be disposed (e.g., embedded) in an exterior surface portion (e.g., a plastic surface portion or portion of any other suitable material) of a body member 2208 (e.g., ornament body) of apparatus 2205. For example lighting assemblies 2210 may be embedded in a surface portion of body member 2208 so as to be evenly disposed with respect to an exterior surface of apparatus 2205. As illustrated in FIG. 22, lighting assembly 2210 may include a light-diffusing surface portion 2220 that may form an exterior portion of lighting assembly 2210 and an exterior surface of apparatus 2205. Also for example, body member 2208 may be translucent (e.g., and/or transparent) and lighting assemblies 2210 may be disposed in, partially in, or behind (e.g., within apparatus 2205) body member 2208.

As illustrated in FIGS. 21 and 22, apparatus 2205 may include an attachment device 2215 that may be disposed at an exterior portion of apparatus 2205. For example, attachment device 2215 may be disposed at an upper portion of apparatus 2205. Attachment device 2215 may be an ornament collar. Attachment device 2215 may be attached to a movable member 2225 and a switch 2230. Movable member 2225 may be a hook, clip, or any other suitable fastener for attaching apparatus 2205 to a support structure (e.g., structure 1601 or structure 1701). Switch 2230 may be any suitable electrical switch for controlling an operation of system 2200 (e.g., for turning apparatus 2205 on and off). Movable member 2225 may be an on/off hook that may be operably connected to switch 2230 and that may be selectively moved (e.g., rotated) by a user to operate switch 2230 to control system 2200.

Apparatus 2205 may include a circuit board 2235 that may be similar to circuit board 1835 described above. Circuit board 2235 may be attached to and supported by one or more support members 2240. Circuit board 2235 may include any suitable electronic components 2250 such as control electronics for controlling an operation of system 2200. Support members 2240 may be attached to an interior wall portion of body member 2208 or may be an integral portion of body member 2208 that protrudes into an interior of a cavity 2245 of apparatus 2205 formed by body member 2208.

Support members 2240 may also support a support assembly 2255 that may support the exemplary disclosed components of apparatus 2205 within cavity 2245. For example, support assembly 2255 may structurally support portions of circuit board 2235, a receiving coil 2260, and a power storage 2265. Receiving coil 2260 may be similar to receiving coil 1850, receiving coil 1323, and/or receiving coil 521 described above. Power storage 2265 may be similar to power storage 1840 described above and may include components similar to Graphene battery 823 and Graphene battery 923 described above. Power storage 2265 may be electrically connected to switch 2230 via one or more electrical connectors 2270. Electrical connector 2270 may be any suitable electrical connector such as a wire (e.g., switch wire), power cable, power cord, or any other suitable connector. Receiving coil 2260 and power storage 2265 may operate similarly to the exemplary disclosed receiving coils and power storages described herein.

In at least some exemplary embodiments, power storage 2265 may be a high-efficiency battery. For example, power storage 2265 may be a Graphene battery such as a Graphene stack battery. Power storage 2265 may be similar to Graphene battery 823, including a one atom thick Graphene strip with an insulator (e.g., similar to insulator 830) of similar thickness (e.g., one atom) with a bonding to a lead area at each end (e.g., similar to end 828). For example, Graphene layers disposed between insulation layers of power storage 2265 may be one atom thick.

Figure 23:
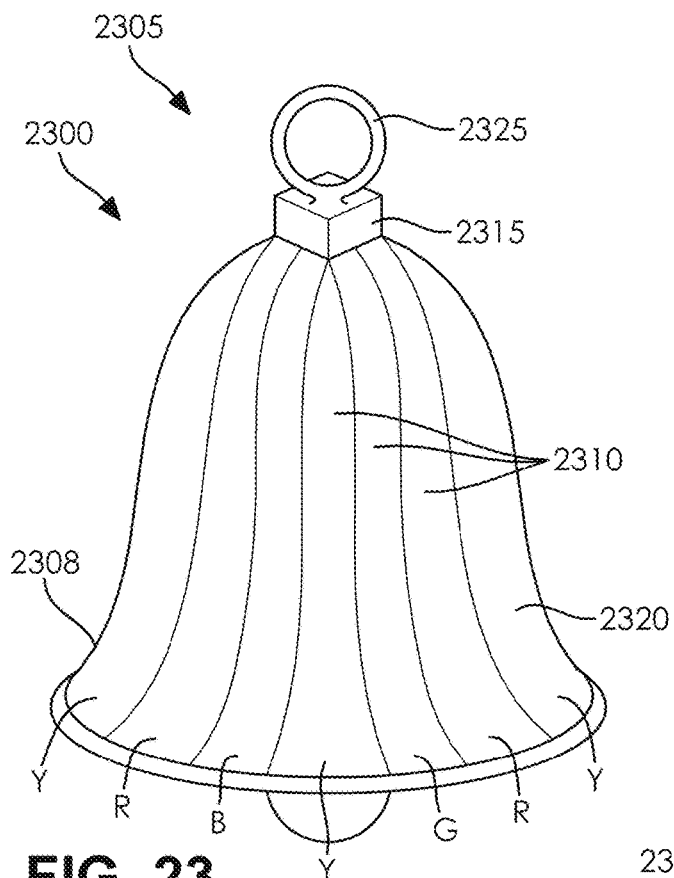
FIG. 23 depicts an additional exemplary embodiment of the present disclosure.
Figure 24:
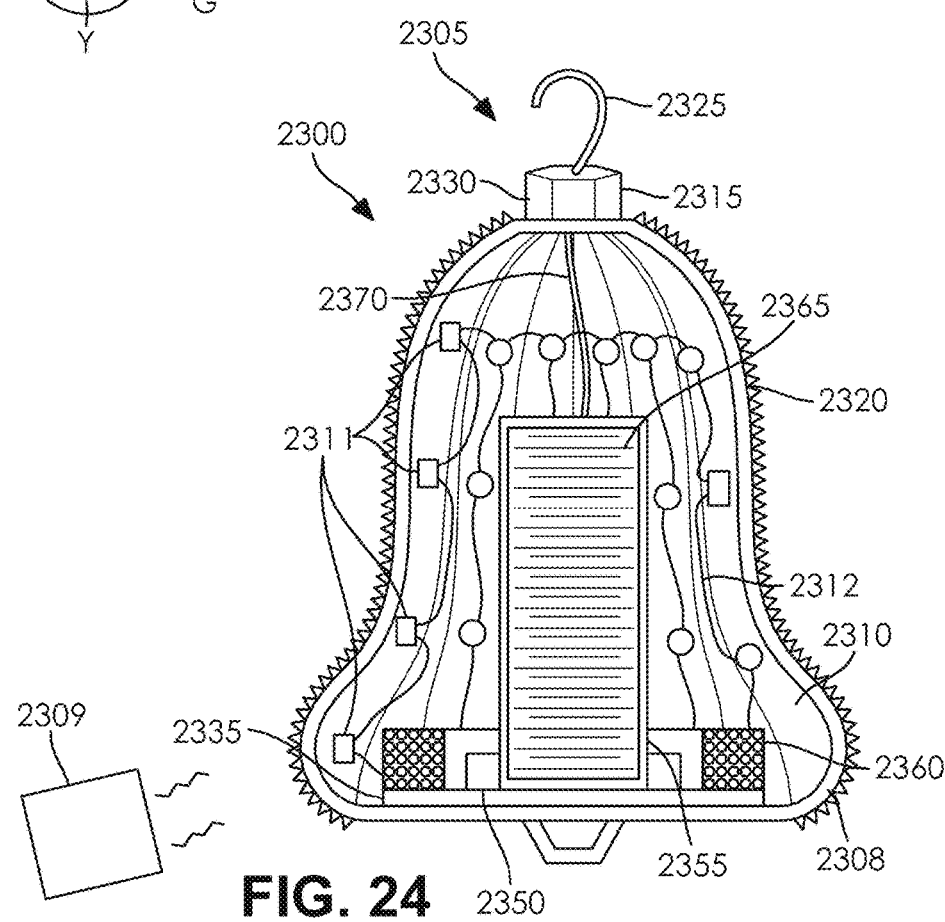
FIG. 24 depicts an additional exemplary embodiment of the present disclosure.

FIGS. 23 and 24 illustrate another exemplary embodiment of the exemplary disclosed apparatus and method. System 2300 may include an apparatus 2305 that may be a decorative assembly such as an ornament assembly (e.g., an LED holiday ornament assembly such as a Christmas ornament). For example, apparatus 2305 may be a bell or bell-shaped ornament. FIG. 23 illustrates a side view of apparatus 2305. FIG. 24 illustrates a sectional view of apparatus 2305. Apparatus 2305 may be included in systems 1600 and/or 1700 as an alternative to and/or in addition to lighting assemblies 1602 and 1702 (e.g., and operate similarly to lighting assemblies 1602 and 1702).

As illustrated in FIGS. 23 and 24, apparatus 2305 may include a plurality of lighting assemblies 2310 that may be similar to lighting assemblies 2210. Lighting assembly 2310 may include one or more lighting elements 2311 that may be similar to lighting elements 2211. Lighting elements 2311 may be electrically connected via one or more electrical connectors 2312 (e.g., LED wiring). As illustrated in FIG. 23, a plurality of lighting assemblies 2310 may be disposed along an exterior of apparatus 2305 as segmented exterior color stripes. For example as illustrated in FIG. 23, lighting assemblies 2310 may include yellow ("Y") LEDs, red ("R") LEDs, blue ("B") LEDs, green ("G") LEDs, and/or any other desired color (e.g., white and/or violet). A plurality of lighting elements 2311 may form each lighting assembly 2310 similarly for example as described above regarding FIGS. 21 and 22. System 2300 may include a remote control device 2309 that may be similar to remote control device 2209. Lighting assemblies 2310 may change color between a pattern of colors in a rotating (e.g., "chasing") manner, similar to as described above regarding lighting assemblies 2210.

Lighting assemblies 2310 may be disposed in an exterior surface portion of a body member 2308 (e.g., ornament body) similarly to as described above regarding lighting assemblies 2210 being disposed or embedded in body member 2208. Lighting assembly 2310 may include a light-diffusing surface portion 2320 that may be similar to light-diffusing surface portion 2220.

As illustrated in FIGS. 23 and 24, apparatus 2305 may include an attachment device 2315 that may be similar to attachment device 2215. Apparatus 2305 may also include a movable member 2325 and a switch 2330 that may be similar to movable member 2225 and switch 2230, respectively.

Apparatus 2305 may include a circuit board 2335 that may be similar to circuit board 2235. Circuit board 2335 may be supported by an interior surface of body member 2308 and/or one or more support members of apparatus 2305 that may be similar to support members 2240. Circuit board 2335 may include electronic components 2350 that may be similar to electronic components 2250.

Apparatus 2305 may include a support assembly 2355 that may be similar to support assembly 2255. Apparatus 2305 may also include a receiving coil 2360 that may be similar to receiving coil 2260 and a power storage 2365 that may be similar to power storage 2265. Power storage 2365 may be electrically connected to switch 2330 via one or more electrical connectors 2370 that may be similar to electrical connector 2270.

In at least some exemplary embodiments, the exemplary disclosed apparatus may include a lighting component, an energy storage assembly electrically connected to the lighting component, and a housing. The energy storage assembly may be a Graphene stack battery that includes a Graphene strip. The energy storage assembly may be disposed on or in the housing. The lighting component may be disposed on or in the housing. The Graphene strip may be a folded Graphene strip with a folded serpentine shape having intervening insulation strips disposed between a plurality of folded Graphene strip portions with leads at the two ends of the Graphene strip. The lighting component may form a segment of an exterior surface portion of the housing. The lighting component may be an LED and the segment may be an LED color stripe. The lighting component may be a multi-colored lighting component that is configured to change color based on control by a remote control device. The exemplary disclosed apparatus may be an energy receiving component electrically connected to the energy storage assembly. The energy receiving component may wirelessly receive energy. The lighting component may be an LED, and the energy receiving component may be a coil or a multi-level antenna. The received energy may be transferred to the energy storage assembly and may power the lighting component, and the energy receiving component may be disposed in the housing. The energy storage assembly may be attached via electrical leads to the lighting component. The received energy may power the lighting component based on being transferred from the energy storage assembly disposed in the housing to the lighting component disposed on or in the housing via the electrical leads. The apparatus may be a ball ornament or a bell ornament. The Graphene strip may be a single atom Graphene strip and the insulator strip may be a cellulose strip.

In at least some exemplary embodiments, the exemplary disclosed method may include providing a plurality of lighting components, electrically connecting an energy storage assembly to the plurality of lighting components, and disposing the plurality of lighting components and the energy storage assembly on or in a housing. The energy storage assembly may be a Graphene stack battery that includes a Graphene strip. The Graphene strip may be a folded Graphene strip with a folded serpentine shape having intervening insulation strips disposed between a plurality of folded Graphene strip portions with leads at the two ends of the Graphene strip. The exemplary disclosed method may also include disposing each of the plurality of lighting components as a segment of an exterior surface portion of the housing to form a segmented exterior of the housing. Each segment formed by each of the plurality of lighting components may be an LED color stripe. The exemplary disclosed method may also include selectively operating each of the plurality of lighting components to independently light each corresponding segment to be a desired color. The exemplary disclosed method may further include selectively operating each of the plurality of lighting components to provide a chasing effect in which the desired color is displayed in succession across adjacent segments. The exemplary disclosed method may also include disposing an energy receiving component on or in the housing, electrically connecting the energy receiving component to the energy storage assembly, and wirelessly receiving energy using the energy receiving component. The exemplary disclosed method may further include transferring the received energy from the energy receiving component to the energy storage assembly, and powering the plurality of lighting components with the energy storage assembly using the received energy.

In at least some exemplary embodiments, the exemplary disclosed apparatus may include a plurality of lighting components, an energy storage assembly electrically connected to the plurality of lighting components, and a housing. The energy storage assembly may be a Graphene stack battery that includes a Graphene strip. The energy storage assembly may be disposed on or in the housing. The plurality of lighting components may be disposed on the housing. The Graphene strip may be a folded Graphene strip with a folded serpentine shape having intervening insulation strips disposed between a plurality of folded Graphene strip portions with leads at the two ends of the Graphene strip. The plurality of lighting components disposed on the housing may form a segmented exterior of the housing. Each of the plurality of lighting components may be a multi-color LED component configured to be selectively, independently operated to provide a chasing effect in which a desired color is displayed in succession across adjacent lighting components.

In at least some exemplary embodiments, the exemplary disclosed apparatus may include a housing (e.g., housing 1807), a lighting component (e.g., lighting assembly 1810) supported by the housing, an energy storage assembly (e.g., power storage 1840) disposed in a first cavity (e.g., cavity 1808) of the housing and electrically connected to the lighting component, a control assembly (e.g., circuit board 1835) disposed in the first cavity of the housing and electrically connected to the energy storage assembly, and an energy receiving component (e.g., receiving coil 1850 or receiving coil 2150) electrically connected to the control assembly via at least one lead disposed in at least one second cavity (e.g., cavity 1875) of the housing. The energy receiving component may wirelessly receive energy. The energy storage assembly may include a Graphene strip. The at least one second cavity may be formed in at least one rib of the housing. The at least one second cavity may be formed between a plurality of ribs of the housing. The energy receiving component may be disposed in a base assembly that may be attached to the housing. The exemplary disclosed apparatus may also include an attachment assembly that is removably attachable to the base assembly. The attachment assembly may be a clip. The lighting component may be a flickering LED and the housing is an insulating tube. The energy storage assembly may be a Graphene stack battery and the Graphene strip may be a folded Graphene strip or a coiled Graphene strip. The energy receiving component may be selected from the group consisting of a coil and a multi-level antenna.

In at least some exemplary embodiments, the exemplary disclosed system may include a lighting apparatus (e.g., apparatus 1805) having a housing (e.g., housing 1807), an LED supported by the housing, an energy storage assembly (e.g., power storage 1840) disposed in a first cavity (e.g., cavity 1808) of the housing and electrically connected to the LED, a control assembly (e.g., circuit board 1835) disposed in the first cavity of the housing and electrically connected to the energy storage assembly, and an energy receiving component (e.g., receiving coil 1850 or receiving coil 2150) electrically connected to the control assembly via at least one lead disposed in at least one second cavity (e.g., cavity 1875) of the housing, an energy source (e.g., source of energy 1603), and an attachment assembly (e.g., attachment assembly 1895) that is removably attachable to the lighting apparatus. The energy receiving component may wirelessly receive energy from the energy source. The control assembly may include a double-sided electronics board. The energy source may be a Wi-Fi radiation source and the energy may be captured from Wi-Fi radiation. The exemplary disclosed system may further include a remote control device configured to control the energy source that may be selected from the group consisting of a wireless Wi-Fi device and a wireless RF device. The housing may include at least one rib that forms the at least one second cavity. The exemplary disclosed system may further include a support structure (e.g., attachment assembly 2195) to which the lighting apparatus is removably attachable, wherein the support structure is selected from the group consisting of a candelabra and a chandelier.

In at least some exemplary embodiments, the exemplary disclosed apparatus may include a housing (e.g., housing 1807 such as a candle-shaped insulating tube), a lighting assembly (e.g., lighting assembly 1810 such as a flickering LED) supported by the candle-shaped insulating tube, a power storage (e.g., power storage 1840 such as a battery) disposed in a first cavity (e.g., cavity 1808) of the candle-shaped insulating tube and electrically connected to the flickering LED, a circuit board (e.g., circuit board 1835) disposed in the first cavity of the candle-shaped insulating tube and electrically connected to the battery, and an energy harvesting coil (e.g., receiving coil 1850 or receiving coil 2150) electrically connected to the circuit board via at least one lead disposed in at least one second cavity of the candle-shaped insulating tube. The energy harvesting coil may wirelessly receive energy. The battery may include a Graphene strip. The energy harvesting coil may be disposed in a base assembly that may be attached to the candle-shaped insulating tube. The exemplary disclosed apparatus may include an attachment assembly (e.g., attachment assembly 1895 or attachment assembly 2195) having a protrusion that may be removably receivable in a base cavity of the base assembly. The cavity may include a member (e.g., member 1905 or member 2205) such as a flexible ring that may be molded into the base cavity and configured to removably receive the protrusion. The base assembly may be a candle-tray-shaped assembly and the attachment assembly may be a clip.

The exemplary disclosed apparatus and method may be used in any suitable application for harvesting energy. For example, the exemplary disclosed apparatus and method may be used in any application involving harvesting energy from sources such as Wi-Fi and/or radiofrequency sources. Also for example, the exemplary disclosed apparatus and method may be used in any application involving harvesting energy for use in a light such as an LED light.

The exemplary disclosed apparatus and method may provide an efficient and effective technique for operating a light such as an LED. For example, some exemplary embodiments may improve a user's ease of LED use. For example, this facilitation may be a result of reducing the user's effort in untangling wired LED strings after they have been stored, based on eliminating power wiring in at least some exemplary embodiments. In some exemplary embodiments, the number and type of locations or applications where LEDs may be employed may be increased. Such exemplary increased LED application potential may be a result of powering LEDs from wireless sources, and storing the energy when not in use (e.g., for use when the energy is utilized by the LED). In some exemplary embodiments, an LED operating cost may be reduced. Such reduced LED operating cost may be a result of longer lasting LED illumination powered with energy harvested from Wi-Fi or RF (e.g., radiofrequency) sources.

Some exemplary embodiments may increase protection of the natural environment. This facilitation may be a result of powering an LED with harvested ambient energy, without involving the generation of new energy in at least some exemplary embodiments. At least some exemplary embodiments may reduce the user's effort in adjusting or organizing an LED display. This facilitation may be a result of eliminating LED power wiring, which may allow a user to move and/or reorganize the LEDs without regard to attachment criteria. In at least some exemplary embodiments, the range of potential LED device design solutions may be increased. Such increased LED device design solutions may be a result of a novel Graphene battery technology having increased charge storage with reduced battery size. Various examples may provide a method to manufacture a Graphene Capacitor/Battery with reduced size that may be capable of storing adequate charge to power the LED for a useful time period.

In the Summary above and in this Detailed Description, and the claims below, and in the accompanying drawings, reference is made to particular features of various embodiments of the invention. It is to be understood that the disclosure of embodiments of the invention in this specification includes all possible combinations of such particular features. For example, where a particular feature is disclosed in the context of a particular aspect or embodiment of the invention, or a particular claim, that feature can also be used—to the extent possible—in combination with and/or in the context of other particular aspects and embodiments of the invention, and in the invention generally.

While multiple embodiments are disclosed, still other embodiments of the present invention will become apparent to those skilled in the art from this detailed description. The invention is capable of myriad modifications in various obvious aspects, all without departing from the spirit and scope of the present invention. Accordingly, the drawings and descriptions are to be regarded as illustrative in nature and not restrictive.

It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments.

In the present disclosure, various features may be described as being optional, for example, through the use of the verb "may;", or, through the use of any of the phrases:

"in some embodiments," "in some implementations," "in some designs," "in various embodiments," "in various implementations,", "in various designs," "in an illustrative example," or "for example;" or, through the use of parentheses. For the sake of brevity and legibility, the present disclosure does not explicitly recite each and every permutation that may be obtained by choosing from the set of optional features. However, the present disclosure is to be interpreted as explicitly disclosing all such permutations. For example, a system described as having three optional features may be embodied in seven different ways, namely with just one of the three possible features, with any two of the three possible features or with all three of the three possible features.

In various embodiments. elements described herein as coupled or connected may have an effectual relationship realizable by a direct connection or indirectly with one or more other intervening elements.

In the present disclosure, the term "any" may be understood as designating any number of the respective elements, i.e. as designating one, at least one, at least two, each or all of the respective elements. Similarly, the term "any" may be understood as designating any collection(s) of the respective elements, i.e. as designating one or more collections of the respective elements, a collection comprising one, at least one, at least two, each or all of the respective elements. The respective collections need not comprise the same number of elements.

While various embodiments of the present invention have been disclosed and described in detail herein, it will be apparent to those skilled in the art that various changes may be made to the configuration, operation and form of the invention without departing from the spirit and scope thereof. In particular, it is noted that the respective features of embodiments of the invention, even those disclosed solely in combination with other features of embodiments of the invention, may be combined in any configuration excepting those readily apparent to the person skilled in the art as nonsensical. Likewise, use of the singular and plural is solely for the sake of illustration and is not to be interpreted as limiting.

In the present disclosure, all embodiments where "comprising" is used may have as alternatives "consisting essentially of," or "consisting of." In the present disclosure, any method or apparatus embodiment may be devoid of one or more process steps or components. In the present disclosure, embodiments employing negative limitations are expressly disclosed and considered a part of this disclosure.

Certain terminology and derivations thereof may be used in the present disclosure for convenience in reference only and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

The term "comprises" and grammatical equivalents thereof are used herein to mean that other components, ingredients, steps, among others, are optionally present. For example, an embodiment "comprising" (or "which comprises") components A, B and C can consist of (i.e., contain only) components A, B and C, or can contain not only components A, B, and C but also contain one or more other components.

Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context excludes that possibility).

The term "at least" followed by a number is used herein to denote the start of a range beginning with that number (which may be a range having an upper limit or no upper limit, depending on the variable being defined). For example, "at least 1" means 1 or more than 1. The term "at most" followed by a number (which may be a range having 1 or 0 as its lower limit, or a range having no lower limit, depending upon the variable being defined). For example, "at most 4" means 4 or less than 4, and "at most 40%" means 40% or less than 40%. When, in this specification, a range is given as "(a first number) to (a second number)" or "(a first number)—(a second number)," this means a range whose limit is the second number. For example, 25 to 100 mm means a range whose lower limit is 25 mm and upper limit is 100 mm.

Many suitable methods and corresponding materials to make each of the individual parts of embodiment apparatus are known in the art. According to an embodiment of the present invention, one or more of the parts may be formed by machining, 3D printing (also known as "additive" manufacturing), CNC machined parts (also known as "subtractive" manufacturing), and injection molding, as will be apparent to a person of ordinary skill in the art. Metals, wood, thermoplastic and thermosetting polymers, resins and elastomers as may be described herein-above may be used. Many suitable materials are known and available and can be selected and mixed depending on desired strength and flexibility, preferred manufacturing method and particular use, as will be apparent to a person of ordinary skill in the art.

Any element in a claim herein that does not explicitly state "means for" performing a specified function, or "step for" performing a specific function, is not to be interpreted as a "means" or "step" clause as specified in 35 U.S.C. § 112 (f). Specifically, any use of "step of" in the claims herein is not intended to invoke the provisions of 35 U.S.C. § 112 (f).

According to an embodiment of the present invention, the system and method may be accomplished through the use of one or more computing devices. One of ordinary skill in the art would appreciate that an exemplary system appropriate for use with embodiments in accordance with the present application may generally include one or more of a Central processing Unit (CPU), Random Access Memory (RAM), a storage medium (e.g., hard disk drive, solid state drive, flash memory, cloud storage), an operating system (OS), one or more application software, a display element, one or more communications means, or one or more input/output devices/means. Examples of computing devices usable with embodiments of the present invention include, but are not limited to, proprietary computing devices, personal computers, mobile computing devices, tablet PCs, mini-PCs, servers or any combination thereof. The term computing device may also describe two or more computing devices communicatively linked in a manner as to distribute and share one or more resources, such as clustered computing devices and server banks/farms. One of ordinary skill in the art would understand that any number of computing devices could be used, and embodiments of the present invention are contemplated for use with any computing device.

In various embodiments, communications means, data store(s), processor(s), or memory may interact with other components on the computing device, in order to effect the provisioning and display of various functionalities associated with the system and method detailed herein. One of ordinary skill in the art would appreciate that there are numerous configurations that could be utilized with embodiments of the present invention, and embodiments of the present invention are contemplated for use with any appropriate configuration.

According to an embodiment of the present invention, the communications means of the system may be, for instance, any means for communicating data over one or more networks or to one or more peripheral devices attached to the system. Appropriate communications means may include, but are not limited to, circuitry and control systems for providing wireless connections, wired connections, cellular connections, data port connections, Bluetooth connections, or any combination thereof. One of ordinary skill in the art would appreciate that there are numerous communications means that may be utilized with embodiments of the present invention, and embodiments of the present invention are contemplated for use with any communications means.

Throughout this disclosure and elsewhere, block diagrams and flowchart illustrations depict methods, apparatuses (i.e., systems), and computer program products. Each element of the block diagrams and flowchart illustrations, as well as each respective combination of elements in the block diagrams and flowchart illustrations, illustrates a function of the methods, apparatuses, and computer program products. Any and all such functions ("disclosed functions") can be implemented by computer program instructions; by special-purpose, hardware-based computer systems; by combinations of special purpose hardware and computer instructions; by combinations of general purpose hardware and computer instructions; and so on—any and all of which may be generally referred to herein as a "circuit," "module," or "system."

While the foregoing drawings and description may set forth functional aspects of the disclosed systems, no particular arrangement of software for implementing these functional aspects should be inferred from these descriptions unless explicitly stated or otherwise clear from the context.

Each element in flowchart illustrations may depict a step, or group of steps, of a computer-implemented method. Further, each step may contain one or more sub-steps. For the purpose of illustration, these steps (as well as any and all other steps identified and described above) are presented in order. It will be understood that an embodiment can contain an alternate order of the steps adapted to a particular application of a technique disclosed herein. All such variations and modifications are intended to fall within the scope of this disclosure. The depiction and description of steps in any particular order is not intended to exclude embodiments having the steps in a different order, unless required by a particular application, explicitly stated, or otherwise clear from the context.

Traditionally, a computer program consists of a sequence of computational instructions or program instructions. It will be appreciated that a programmable apparatus (i.e., computing device) can receive such a computer program and, by processing the computational instructions thereof, produce a further technical effect.

A programmable apparatus may include one or more microprocessors, microcontrollers, embedded microcontrollers, programmable digital signal processors, programmable devices, programmable gate arrays, programmable array logic, memory devices, application specific integrated circuits, or the like, which can be suitably employed or configured to process computer program instructions, execute computer logic, store computer data, and so on. Throughout this disclosure and elsewhere a computer can include any and all suitable combinations of at least one general purpose computer, special-purpose computer, programmable data processing apparatus, processor, processor architecture, and so on.

It will be understood that a computer can include a computer-readable storage medium and that this medium may be internal or external, removable and replaceable, or fixed. It will also be understood that a computer can include a Basic Input/Output System (BIOS), firmware, an operating system, a database, or the like that can include, interface with, or support the software and hardware described herein.

Embodiments of the system as described herein are not limited to applications involving conventional computer programs or programmable apparatuses that run them. It is contemplated, for example, that embodiments of the invention as claimed herein could include an optical computer, quantum computer, analog computer, or the like.

Regardless of the type of computer program or computer involved, a computer program can be loaded onto a computer to produce a particular machine that can perform any and all of the disclosed functions. This particular machine provides a means for carrying out any and all of the disclosed functions.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

In some embodiments, computer program instructions may be stored in a computer-readable memory capable of directing a computer or other programmable data processing apparatus to function in a particular manner. The instructions stored in the computer-readable memory constitute an article of manufacture including computer-readable instructions configured to implement any and all of the disclosed functions.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

The elements depicted in flowchart illustrations and block diagrams throughout the figures imply logical boundaries between the elements. However, according to software or hardware engineering practices, the disclosed elements and the functions thereof may be implemented as parts of a monolithic software structure, as standalone software modules, or as modules that employ external routines, code, services, and so forth, or any combination of these. All such implementations are within the scope of the present disclosure.

Unless explicitly stated or otherwise clear from the context, the verbs "execute" and "process" are used interchangeably to indicate execute, process, interpret, compile, assemble, link, load, any and all combinations of the foregoing, or the like. Therefore, embodiments that execute or process computer program instructions, computer-executable code, or the like can suitably act upon the instructions or code in any and all of the ways just described.

The functions and operations presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will be apparent to those of skill in the art, along with equivalent variations. In addition, embodiments of the invention are not described with reference to any particular programming language. It is appreciated that a variety of programming languages may be used to implement the present teachings as described herein, and any references to specific languages are provided for disclosure of enablement and best mode of embodiments of the invention. Embodiments of the invention are well suited to a wide variety of computer network systems over numerous topologies. Within this field, the configuration and management of large networks include storage devices and computers that are communicatively coupled to dissimilar computers and storage devices over a network, such as the Internet.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. An apparatus, comprising:
   a lighting component;
   an energy storage assembly electrically connected to the lighting component; and
   a housing;
   wherein the energy storage assembly is a Graphene stack battery that includes a Graphene strip;
   wherein the energy storage assembly is disposed on or in the housing;
   wherein the lighting component is disposed on or in the housing; and
   wherein the Graphene strip is a folded Graphene strip with a folded serpentine shape having intervening insulation strips disposed between a plurality of folded Graphene strip portions with leads at the two ends of the Graphene strip.

2. The apparatus of claim 1, wherein the lighting component forms a segment of an exterior surface portion of the housing.

3. The apparatus of claim 1, wherein the lighting component is a multi-colored lighting component that is configured to change color based on control by a remote control device.

4. The apparatus of claim 1, further comprising an energy receiving component electrically connected to the energy storage assembly;
   wherein the energy receiving component wirelessly receives energy.

5. The apparatus of claim 1, wherein the apparatus is a ball ornament or a bell ornament.

6. The apparatus of claim 1, wherein the Graphene strip is a single atom Graphene strip and the insulator strip is a cellulose strip.

7. The apparatus of claim 2, wherein the lighting component is an LED and the segment is an LED color stripe.

8. The apparatus of claim 4, wherein:
   the lighting component is an LED; and
   the energy receiving component is a coil or a multi-level antenna.

9. The apparatus of claim 4, wherein:
   the received energy is transferred to the energy storage assembly and powers the lighting component; and
   the energy receiving component is disposed in the housing.

10. The apparatus of claim 4, wherein:
    the energy storage assembly is attached via electrical leads to the lighting component; and
    the received energy powers the lighting component based on being transferred from the energy storage assembly disposed in the housing to the lighting component disposed on or in the housing via the electrical leads.

11. A method, comprising:
    providing a plurality of lighting components;
    electrically connecting an energy storage assembly to the plurality of lighting components; and
    disposing the plurality of lighting components and the energy storage assembly on or in a housing;
    wherein the energy storage assembly is a Graphene stack battery that includes a Graphene strip; and
    wherein the Graphene strip is a folded Graphene strip with a folded serpentine shape having intervening insulation strips disposed between a plurality of folded Graphene strip portions with leads at the two ends of the Graphene strip.

12. The method of claim 11, further comprising disposing each of the plurality of lighting components as a segment of an exterior surface portion of the housing to form a segmented exterior of the housing.

13. The method of claim 11, further comprising:
    disposing an energy receiving component on or in the housing;
    electrically connecting the energy receiving component to the energy storage assembly; and
    wirelessly receiving energy using the energy receiving component.

14. The method of claim 12, wherein each segment formed by each of the plurality of lighting components is an LED color stripe.

15. The method of claim 12, further comprising selectively operating each of the plurality of lighting components to independently light each corresponding segment to be a desired color.

16. The method of claim 15, further comprising selectively operating each of the plurality of lighting components to provide a chasing effect in which the desired color is displayed in succession across adjacent segments.

17. The method of claim 13, further comprising:
transferring the received energy from the energy receiving component to the energy storage assembly; and
powering the plurality of lighting components with the energy storage assembly using the received energy.

18. An apparatus, comprising:
a plurality of lighting components;
an energy storage assembly electrically connected to the plurality of lighting components; and
a housing;
wherein the energy storage assembly is a Graphene stack battery that includes a Graphene strip;
wherein the energy storage assembly is disposed on or in the housing;
wherein the plurality of lighting components are disposed on the housing; and
wherein the Graphene strip is a folded Graphene strip with a folded serpentine shape having intervening insulation strips disposed between a plurality of folded Graphene strip portions with leads at the two ends of the Graphene strip.

19. The apparatus of claim 18, wherein the plurality of lighting components disposed on the housing form a segmented exterior of the housing.

20. The apparatus of claim 19, wherein each of the plurality of lighting components is a multi-color LED component configured to be selectively, independently operated to provide a chasing effect in which a desired color is displayed in succession across adjacent lighting components.

* * * * *